(12) United States Patent
Horita et al.

(10) Patent No.: US 6,303,432 B1
(45) Date of Patent: Oct. 16, 2001

(54) METHOD OF MANUFACTURING A SEMICONDUCTOR DEVICE

(75) Inventors: Katsuyuki Horita; Takashi Kuroi; Yasuyoshi Itoh; Katsuomi Siozawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/411,386

(22) Filed: Oct. 4, 1999

(30) Foreign Application Priority Data

May 24, 1999 (JP) .................................................. 11-143196

(51) Int. Cl.[7] ...................... H01L 21/8242; H01L 21/20; H01L 21/3205; H01L 21/44
(52) U.S. Cl. ........................ 438/253; 438/239; 438/251; 438/256; 438/393; 438/394; 438/399; 438/586; 438/595; 438/657; 438/682
(58) Field of Search ............................ 438/253, 238–256, 438/381–399, 585–586, 595, 655–657, 682–685

(56) References Cited

U.S. PATENT DOCUMENTS 6,146,994 * 11/2000 Hwang ................................. 438/633

FOREIGN PATENT DOCUMENTS

| 1-264257 | 10/1989 | (JP) . |
| 9-181269 | 7/1997 | (JP) . |
| 10-256511 | 9/1998 | (JP) . |

\* cited by examiner

*Primary Examiner*—John F. Niebling
*Assistant Examiner*—Ha Tran Nguyen
(74) *Attorney, Agent, or Firm*—McDermott, Will & Emery

(57) ABSTRACT

There is described a method of manufacturing a semiconductor device, wherein a DRAM memory cell and a logic circuit are fabricated on a single semiconductor substrate, which method enables improvements in the refresh characteristics of the DRAM memory cell by preventing a leakage current from developing and enables improvements in the reliability of the semiconductor device, reduces power consumption, and enables improvements in the performance and processing speed of integrated circuits by assembly of the integrated circuits into a single chip. After formation of a polysilicon layer which is to act as gate electrodes, silicon nitride films are formed so as to cover source/drain regions of the DRAM memory cell and to cause other source/drain regions and the polysilicon layer to be exposed. A metal silicide layer is formed on the semiconductor substrate by means of self-aligned silicide technique.

18 Claims, 22 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device including a plurality of field-effect elements of different structures, and more particularly, to a method of manufacturing a semiconductor device including field-effect elements whose gate electrodes comprise metal silicide.

2. Description of the Background Art

Progress in design and processing techniques has enabled fabrication of a sophisticated integrated circuit, wherein a plurality of integrated circuits, which conventionally would be fabricated through different processes, are mounted on a single chip. In this way, an attempt is made to impart improved functions to the integrated circuit and to increase the operating speed of the integrated circuit by assembling the integrated circuits into a single chip. Among integrated circuits having such a structure, an integrated circuit wherein a sophisticated integrated logic circuit (hereinafter referred to as a "logic circuit") such as a micro-processing unit (MPU) and a DRAM (Dynamic Random Access Memory) are formed into a single chip is called a hybrid DRAM. In order to fabricate an integrated circuit like hybrid DRAM, MOS-type field-effect elements having different structures according to the purpose thereof must be assembled into a single chip of the integrated circuit.

In conventional processes through which DRAM and a logic circuit have been fabricated separately, in order to reduce a delay in a logic circuit, metal silicide is formed on the surface of the gate electrode or a source/drain region according to the salicide (self-aligned silicide) technique, thus reducing the resistance of the logic circuit. In DRAM, slight deterioration of the junction characteristics of the source/drain region accounts for volatilization of data stored in a capacitor. For this reason, metal silicide, which would deteriorate the junction characteristics of the source/drain region, is not formed in the source/drain region. Low-resistance material having a polycide structure, which is a multilayered structure comprising polysilicon and a metal silicide film, is used for a gate electrode, thus reducing a delay in the gate electrode.

Since the process for forming the gate electrode of the logic circuit differs from the process for forming the gate electrode of the DRAM, these processes cannot be applied directly to integration of the logic circuit and the DRAM into a single chip. Thus, metal silicide has been formed even on the surface of the gate electrode of a DRAM memory cell by the salicide technique. Accordingly, the surface of the gate electrode of the DRAM memory cell, the surface of the gate electrode of the logic circuit, and the surface of the source/drain region of the logic circuit are provided with a metal silicide layer, thereby reducing a delay in the logic circuit and the DRAM memory cell. Since the metal silicide layer is not formed on the surface of the source/drain region of the DRAM memory cell, a leakage current developing in a pn junction is prevented, thus improving the reliability of the DRAM memory cell.

A method of manufacturing a conventional semiconductor device will now be described by reference to FIGS. 17 through 19. FIGS. 17 through 19 are cross-sectional views showing a process of manufacturing a conventional semiconductor device. In FIG. 17, reference numeral 101 designates a semiconductor substrate; 102 designates an isolation oxide film such as a silicon oxide film; 105 designates a gate oxide film; 106 designates a polysilicon layer; and 1061 designates a silicon nitride film.

First, after formation of the isolation oxide film 102 in an isolation region of the semiconductor substrate 101, the gate oxide film 105, the polysilicon layer 106, and the silicon nitride film 1061 are formed, in this sequence, over the entire surface of the semiconductor substrate 101. The semiconductor substrate 101 is etched while a mask (not shown) is placed on gate electrode formation regions, whereby the silicon nitride film 1061 is left in only the gate electrode formation regions. The polysilicon layer 106 is etched while the silicon nitride film 1061 is used as a mask. FIG. 17 is a cross-sectional view showing the semiconductor device after completion of these manufacturing steps. The silicon nitride film 1061 is then eliminated (not shown).

In FIG. 18, reference numeral 108 designates a side wall; and 1010 through 1015 designate source/drain regions. First, impurities are implanted into the semiconductor substrate 101 through ion implantation, thus forming the source/drain regions 1010 through 1013. A silicon oxide film (not shown) is deposited on the entire surface of the semiconductor substrate 101 through chemical vapor deposition (CVD), and the entirety of the logic circuit is etched back, to thereby form the side walls 108. Subsequently, ions are implanted into the semiconductor substrate 101, so that the source/drain regions 1014 and 1015 are formed. At the time of etchback of the semiconductor substrate 101 for the purpose of forming the side walls 108, the gate oxide film 105 is left on the surfaces of the source/drain regions 1010 to 1013. FIG. 18 is a cross-sectional view showing the semiconductor device after completion of the foregoing manufacturing step.

The gate oxide film 105 is selectively eliminated from the surfaces of the source/drain regions 1014 and 1015 within the logic circuit region (not shown).

In FIG. 19, reference numeral 1071 designates a metal layer; for example a tungsten (W) layer; and 107 designates a metal silicide layer. As shown in the drawing, after formation of a metal (e.g., tungsten) layer 1071 on the entire surface of the semiconductor substrate 101 by means of sputtering, the semiconductor substrate 101 is subjected to heat treatment in a nitrogen atmosphere. The metal silicide layer 107 is formed over the surfaces of the polysilicon layer 106 and the source/drain regions 1014 and 1015 by the salicide technique. FIG. 19 is a cross-sectional view showing the semiconductor device after completion of the foregoing manufacturing step. As is evident from FIG. 19, since the surfaces of the source/drain regions 1010 and 1011 of the DRAM memory cell are covered with the gate oxide film 105, the metal silicide layer 107 is not formed on the surfaces of the source/drain regions 1010 and 1011. Subsequently, the metal layer 1071 which in not utilized for forming the metal silicide layer 107 is eliminated through use of an aqueous ammonium solution (not shown). Capacitors and wiring layers are formed in the semiconductor substrate 101, whereby a conventional semiconductor device is completed (not shown).

Japanese Patent Application Laid-Open No. Hei-1-264257 describes a method of manufacturing a semiconductor device, in which a metal silicide layer is formed on the surfaces of gate electrodes of DRAM memory cells and surrounding circuits as well as on the surfaces of the source/drain regions of the surrounding circuits.

However, in association with progress in miniaturization of semiconductor device, the thickness of the gate oxide film 105 becomes thinner. As a result, the gate oxide film 105, which is exposed during the etchback phase for forming the side walls 108, is also etched, thus in turn exposing the surfaces of the source/drain regions 1010 and 1011. The metal silicide layer 107 is disadvantageously formed on the surfaces of the source/drain regions 1010 and 1011 of the DRAM memory cells, as is the case in the logic circuit. In the event that a metal silicide layer is formed on the sources of the source/drain region of a DRAM memory cell, the junction characteristics of the source/drain region will be deteriorated, thereby causing volatilization of the data stored in a capacitor and considerably degrading reliability of the DRAM memory cell.

Even if the side walls 108 can be formed with the gate oxide film 105 remaining, it is necessary to eliminate the gate oxide film 105 selectively from the surfaces of the source/drain regions 1014 and 1015 of the logic circuit while leaving the gate oxide film 105 on the source/drain regions 1010 and 1011 of the DRAM memory cell. As miniaturization of semiconductor devices is pursued, the individual sections of the semiconductor device are much reduced in size, thus readily causing so-called "mask stacking errors" (displacements between a location where a photoresist mask is to be formed and a location where the photoresist film is actually formed).

FIGS. 20 to 22 are cross-sectional views showing processes for manufacturing the conventional semiconductor device, for the purpose of explaining a method of selectively eliminating the gate oxide film 105 from the surfaces of the source/drain regions 1014 and 1015 of the logic circuit. In FIG. 20, reference numeral 1072 designates a photoresist mask. As shown in FIG. 18, the side walls 108 are formed by leaving the gate oxide film 105 on the surfaces of the source/drain regions 1010, 1011, 1012, and 1013. A photoresist mask 1072 is formed such that openings are formed in the mask so as to correspond to the surfaces of the source/drain regions 1014 and 1015 of the logic circuit. If mask stacking errors arise at this time, a portion of the side walls 108 or a portion of the isolation oxide film 102 will become exposed. The thus-exposed portions are etched away simultaneous with etching of the gate oxide film 105. FIG. 20 is a cross-sectional view of the semiconductor device after completion of the foregoing manufacturing step, showing displacement of the photoresist mask 1072 from its desired location.

After removal of the photoresist mask 1072, the metal silicide layer 107 is formed through the salicide technique, and the side walls 108 are etched away, as designated by X shown in FIG. 21. As a result, the metal silicide layer 107 is formed up to the surfaces of the source/drain regions 1012 and 1013, which have shallow p-n junctions, so that a junction leakage current is likely to arise. Further, as designated by Y shown in FIG. 21, since the isolation oxide film 102 is etched, the metal silicide layer 107 formed on the surface of the source/drain region 1015 is extended to the vicinity of the p-n junction between a lower portion of the source/drain region 1015 and the semiconductor substrate 101.

In FIG. 22, a photoresist mask 1072 formed on the semiconductor substrate 101 has an opening which covers the entirety of the logic circuit. If the gate oxide film 105 that is exposed at this time is etched using the photoresist mask 1072, the side walls 108 and the isolation oxide film 102, which are of the same quality as the gate oxide film 105, are etched simultaneously. FIG. 22 is a cross-sectional view of the semiconductor device after completion of the foregoing manufacturing step. Even in this case, as in the case shown in FIG. 21, a junction leakage current will disadvantageously arise in the edge of the source/drain region 1015 and the p-n junctions of the source/drain regions 1012 and 1013.

SUMMARY OF THE INVENTION

The present invention has been conceived to solve the foregoing problems, and the object of the present invention is to provide a method of manufacturing a semiconductor device including a semiconductor substrate on which a DRAM memory cell and a logic circuit are fabricated, thus preventing a delay and a rise in a threshold value in a logic circuit, preventing a leakage current in a DRAM memory cell and achieving an improvement in the refresh characteristics of the same, achieving an improvement in reliability of the semiconductor device, reducing power consumption, and achieving improved functions and improved processing speed of the integrated circuit due to assembly of the DRAM memory cell and the logic circuit into a single chip.

The above objects of the present invention are achieved by a method of manufacturing a semiconductor device described below. In the method, an isolation dielectric film is formed so as to surround first and second active regions formed on the primary surface of a semiconductor substrate. A polysilicon layer patterned so as to act as a gate electrode is formed on the surfaces of the first and second active regions by way of a gate oxide film. Impurities are implanted into the semiconductor substrate while the polysilicon layer is used as a mask, to thereby form first source drain regions in the first active region and second source drain regions in the second active region. A first silicon nitride film is formed so as to cover the first and second active regions. A photoresist mask is formed such that an opening corresponds to the position of the second active region on the surface of the first silicon nitride film. The first silicon nitride film is etched using the photoresist mask to thereby form side walls of the polysilicon layer on the surface of the second active region. The photoresist mask is removed, then a silicon oxide film is formed so as to cover the first and second active regions. The silicon oxide film and the first silicon nitride film on the surfaces of the first and second active regions are abraded and removed until the polysilicon layer on the surface of the first active region is exposed. After removal of the remaining silicon oxide film, a metal layer is formed so as to cover the first and second active regions. Through heat treatment, a metal silicide layer is formed on the surfaces of the second source drain regions and the surface of the polysilicon layer on the surfaces of the first and second active regions. The metal layer that has not reacted is removed. A capacitor which is connected to one of the first source drain regions is formed. The above objects of the present invention are also achieved by a method of manufacturing a semiconductor device described below. In the method, an isolation dielectric film is formed so as to surround first and second active regions formed on the primary surface of a semiconductor substrate. A polysilicon layer patterned so as to act as a gate electrode is formed on the surfaces of the first and second active regions by way of a gate oxide film. Impurities are implanted into the semiconductor substrate while the polysilicon layer is used as a mask, to thereby form first source drain regions in the first active region and second source drain regions in the second active region. A first silicon nitride film is formed so as to cover the first and second active regions. A photoresist mask is formed such that an opening corresponds to the position of the second active region on the surface of the first silicon nitride film. The first silicon nitride film is etched using the photoresist mask to thereby form side walls of the polysilicon layer on the surface of the second active region. After removal of the photoresist mask, a borophosphosilicate glass (BPSG) film is formed so as to cover the first and second active regions. The BPSG film and the first silicon nitride film on the surfaces of the first and second active regions are abraded and removed until the polysilicon layer on the surface of the first active region is exposed. After removal of the remaining BPSG film, a metal layer is formed so as to cover the first and second active regions. Through heat treatment, a metal silicide layer is formed on the surfaces of the second source drain regions and the surface of the polysilicon layer on the surfaces of the first and second active regions. The metal layer that has not reacted is removed. A capacitor which is connected to one of the first source drain regions is formed.

Other objects and further features of the present invention will be apparent from the following detailed description when read in conjunction with the accompanying drawings.

DESCRIPTION OF THE PREFERRED EMBODIMENTS

Figure 1:
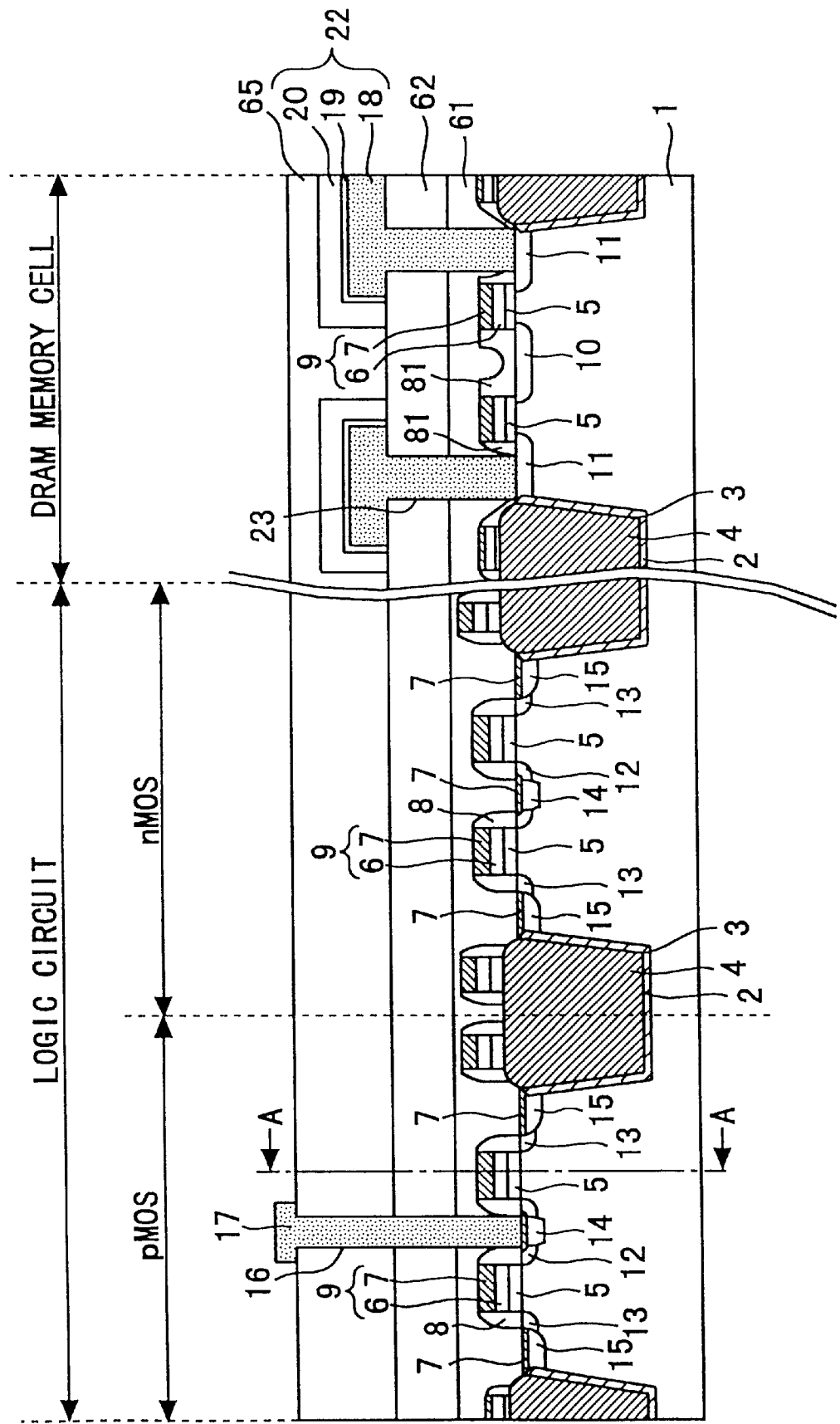
FIG. 1 is a cross-sectional view showing a semiconductor device according to a first embodiment of the present invention.

In the following, principles and embodiments of the present invention will be described with reference to the accompanying drawings.
First Embodiment FIG. 1 is a cross-sectional view showing a semiconductor device according to a first embodiment of the present invention. In the drawing, reference numeral 1 designates a semiconductor substrate; 2 designates a trench; 3 and 4 designate silicon oxide films; 5 designates a gate oxide film; 6 designates a polysilicon layer; 7 designates a metal silicide layer formed by salicide technique; 8 designates a side wall formed from a silicon nitride film; 81 designates a silicon nitride film; 9 designates a gate electrode; 10 through 15 designate source/drain regions; 61, 62, and 65 designate interlayer dielectric films; 16 and 23 designate contact holes; 17 designates a wiring layer; 18 designates a storage node; 19 designates a capacitor dielectric film: 20 designates a cell plate; and 22 designates a capacitor. The gate electrode 9 comprises the polysilicon layer 6 and the metal silicide layer 7 formed from cobalt silicide. A trench isolation structure is constituted by combination of the trench 2 and the silicon oxide films 3 and 4. The trench isolation structure serves as a separation dielectric film and separates active regions from one another.

The wiring layer 17 is connected to the source/drain region 12 by way of the contact hole 16, and the capacitor 22 is connected to the source/drain region 11 by way of the contact hole 23. Wiring layers other than the wiring layer 17 are formed by way of contact holes opened in an interlayer dielectric film so as to connect to the source/drain regions 10 and 13 and the gate electrode 9, respectively (not shown).

In FIG. 1, a DRAM memory cell and a logic circuit are fabricated on a semiconductor substrate 1 which contains impurities at a concentration of about $1\times10^{15}/cm^3$ so as to have a specific resistance of 10Ω·cm. The logic circuit is connected to the DRAM memory cell by way of a sense amplifier and controls the operation of the DRAM memory cell. Generally, the DRAM memory cell and the logic circuit are fabricated so as to be separated from each other, and an element, such as a sense amplifier, is fabricated between them. The sense amplifiers is omitted from the drawing.

In the first embodiment, a transistor of the DRAM memory cell, which acts as a first field-effect element, has a gate length L, of about 200 nm. The width of the trench 2 may differ according to location. The minimum isolation width of the trench 2 ranges from 100 to 200 nm, and the isolation width of the trench 2 ranges from about 200 to 400 nm in areas other than the minimum area. Further, the trench 2 assumes a depth of about 150 to 500 nm. As mentioned above, the width of the trench 2 varies according to location and may assume a value of about 5000 nm in areas other than the memory cell section. In that case, the semiconductor substrate 1 is left even in the regions where no elements are formed (through use of a dummy pattern), thereby controlling the width of the trench 2 so as to lessen irregularities in the surface of a silicon oxide film 4 that has been embedded in the trench 2.

The exposed semiconductor substrate surface within the trench 2 is covered with a silicon oxide film 3 having a thickness of about 5 to 30 nm, and the silicon oxide film 4 is embedded in the trench 2. In a case where defects arising in the semiconductor substrate 1 in the process of forming the trenches 2 in the semiconductor substrate 1 have sufficiently small effects on the characteristics of an element, the silicon oxide film 3 may be deleted.

The gate oxide film 5 is formed to a thickness of about 7 to 10 nm on the surface of the semiconductor substrate 1 within the active region of the DRAM memory cell. The gate electrode 9 is formed on the gate oxide film 5 from a polysilicon layer 6 having a thickness of about 150 to 250 nm and a metal silicide layer 7 having a thickness of about 40 to 60 nm.

The polysilicon layer 6 formed in the DRAM memory cell and an n-MOS region of the logic circuit contains n-type impurities, such as phosphorous or arsenic, at a concentration of about $2\times10^{20}/cm^3$ to $15\times^{20}/cm^3$. The polysilicon layer 6 formed in a p-MOS region of the logic circuit contains p-type impurities, such as boron, at a concentration of about $2\times10^{20}/cm^3$ to $15\times10^{20}/cm^3$. The source/drain regions 10 and 11 contain impurities such as phosphorous or arsenic at a concentration of about $1\times10^{18}/cm^3$.

The capacitor 22 comprises the storage node 18, the capacitor dielectric film 19, and the cell plate 20. The storage node 18 is formed from polycrystalline silicon containing phosphorous at a concentration of about $1\times10^{20}/cm^3$ to $5\times10^{20}/cm^3$. The capacitor dielectric film 19 is formed from a silicon nitride-oxide film having a thickness of about 5 to 10 nm. Further, the cell plate 20 is formed from polycrystalline silicon containing phosphorous at a concentration of about $1\times10^{20}/cm^3$ to $5\times10^{20}/cm^3$. The capacitor 22 is connected to the source/drain region 11. The capacitor 22 is of stacked type in the first embodiment, it may be of another type such as trench type.

In the first embodiment, the transistor of the logic circuit section, serving as a second field-effect element, has a gate length $L_2$ of about 200 nm. The trench 2 of the logic circuit section assumes a width of about 200 to 500 nm and a depth of about 150 to 500 nm.

The source/drain regions 12 and 13 include impurities, such as phosphorous or arsenic (in the n-MOS region) or boron or boron fluoride (in the p-MOS region), at a concentration of about $1\times10^8/cm^3$. Further, the source/drain regions 14 and 15 include impurities, such as phosphorous or arsenic (in the n-MOS region) or boron (in the p-MOS region), at a concentration of about $1\times10^{20}/cm^3$. These source/drain regions 12 through 15 constitute an LDD (lightly-doped drain) structure. The gate oxide film 5 may be of the same thickness as that of the gate oxide film 5 of the DRAM memory cell. However, when the gate oxide film 5 of the logic circuit has a reduced thickness, a sufficient ON current are permitted to flow, thereby realizing a high-speed transistor having superior drive performance. For this reason, a desirable thickness of the gate oxide film 5 of the logic circuit is about 3 to 7 nm. In other respects, the logic circuit has the same configuration as that of the DRAM memory cell.

The operation of the DRAM memory cell will now be described. The DRAM memory cells store data by means of electric charges stored in the capacitors, and refresh (read or write) the data at uniform time intervals. If a junction leakage current flows to an element connected to a capacitor, the data stored in the capacitor are lost, thus deteriorating the refresh characteristics (data holding characteristics) of the DRAM memory cell. Therefore, control of a leakage current becomes more important for the DRAM memory cell than for other portions of the semiconductor device.

At the time of writing of data into the capacitor 22, voltages VG=3.6V and VB=1.0V are imparted to the individual electrodes of the DRAM memory cell, and 0V is applied to bit lines (not shown) connected to the source/drain regions 10. Further, 1.0V is applied to the cell plate 20. In contrast, at the time of erasure of data, voltages VG=3.6V and VB=1.0V are imparted to the individual electrodes of the DRAM memory cell, and 2V is applied to the bit lines (not shown) connected to the source/drain regions 10. Further, 1.0V is applied to the cell plate 20. At the time of reading of data, about 1.0V is applied to the bit lines. These voltages are mere examples and may vary according to the thickness of the gate oxide film or the gate length.

The operation of the logic circuit will now be described. Voltages are applied to the gate electrode 9, the source/drain regions 12 through 15, and the semiconductor substrate (well), and a channel is formed along the surface of the semiconductor substrate 1 below the gate electrode 9. Either a pair of source/drain regions 12 and 14 or another pair of source/drain regions 13 and 15 act as a source, and the other pair acts as a drain, whereby the logic circuit operates. For instance, in the case of an n-MOS transistor, voltages; VG=2.5V, VD=2.5V, VS=0V, VB=0V or like voltages, are applied to the respective electrodes of the logic circuit. These voltages are mere examples and may vary according to the thickness of the gate oxide film or the gate length.

Although the first embodiment describes the present invention by reference to a semiconductor device, in which two transistors are fabricated in a single active region other than a DRAM memory cell, the present invention is not limited to particularly such a semiconductor device.

Figure 2:
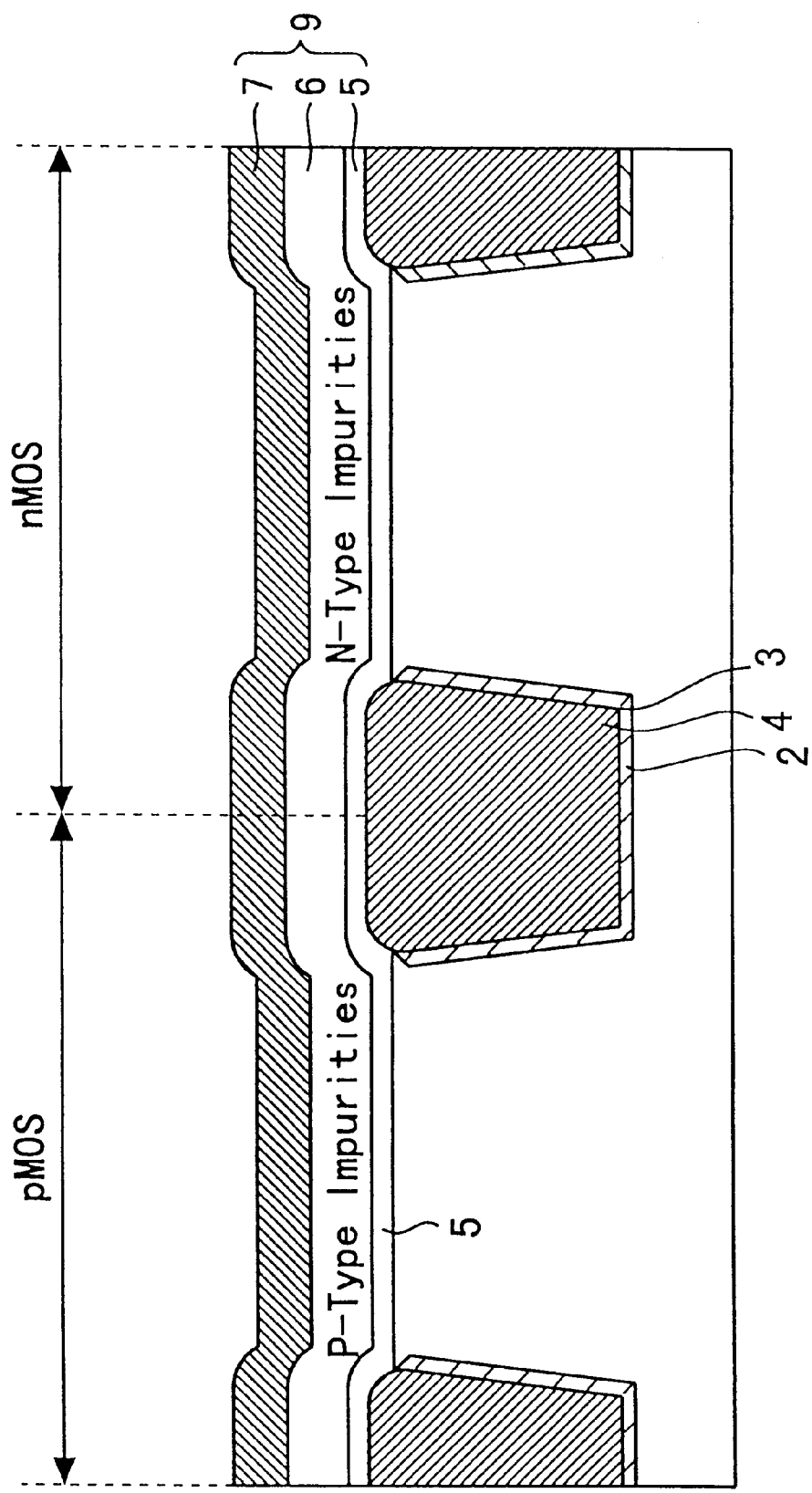
FIGS. 2 to 10 are cross-sectional views for describing a manufacturing method of the semiconductor device according to a the first embodiment of the present invention.

FIG. 2 is a cross-sectional view showing the semiconductor device according to the first embodiment of the present invention. The cross-sectional view is taken along line A—A shown in FIG. 1 at the time when the metal silicide layer 7 is formed. This drawing shows one example of the semiconductor device whose logic circuit is of dual gate structure. The polysilicon layer 6 includes n-type impurities in the n-MOS region and p-type impurities in the p-MOS region. The polysilicon layer 6 and the metal silicide layer 7 formed thereon constitute the gate electrode 9.

Figure 3:
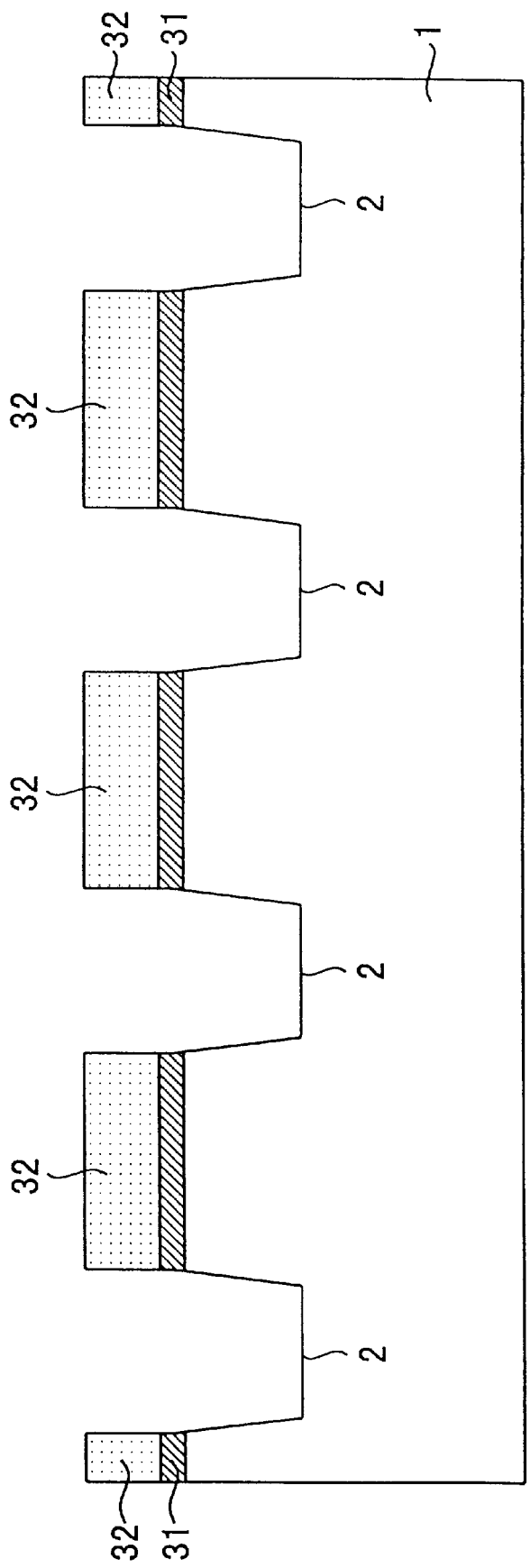

FIGS. 3 through 10 are cross-sectional views showing a process of manufacturing the semiconductor device according to the first embodiment. In FIG. 3, reference numeral 31 designates a silicon oxide film; and 32 designates a silicon nitride film.

The silicon oxide film 31 is formed to a thickness of about 5 to 30 nm on the surface of the semiconductor substrate 1, and the silicon nitride film 32 is formed to a thickness of about 100 to 300 nm on the silicon oxide film 31. The silicon nitride film 32 and the silicon oxide film 31 are selectively removed through anisotropic etching through use of a photoresist mask (not shown) from regions where the trenches 2 are to be formed. After removal of the photoresist mask, the semiconductor substrate 1 is anisotropically etched while the silicon nitride film 32 is used as a mask, thus forming the trenches 2 to a depth of about 100 to 500 nm in the surface of the semiconductor substrate 1. The thus-formed trenches 2 assume a width of about 100 to 500 nm in the logic circuit section and a minimum width of about 100 to 200 nm in the DRAM memory cell. In the remaining areas of the semiconductor substrate 1, the trenches 2 assume a width of about 200 to 400 nm. FIG. 3 is a cross-sectional view showing the semiconductor device after completion of the foregoing manufacturing step.

Figure 4:
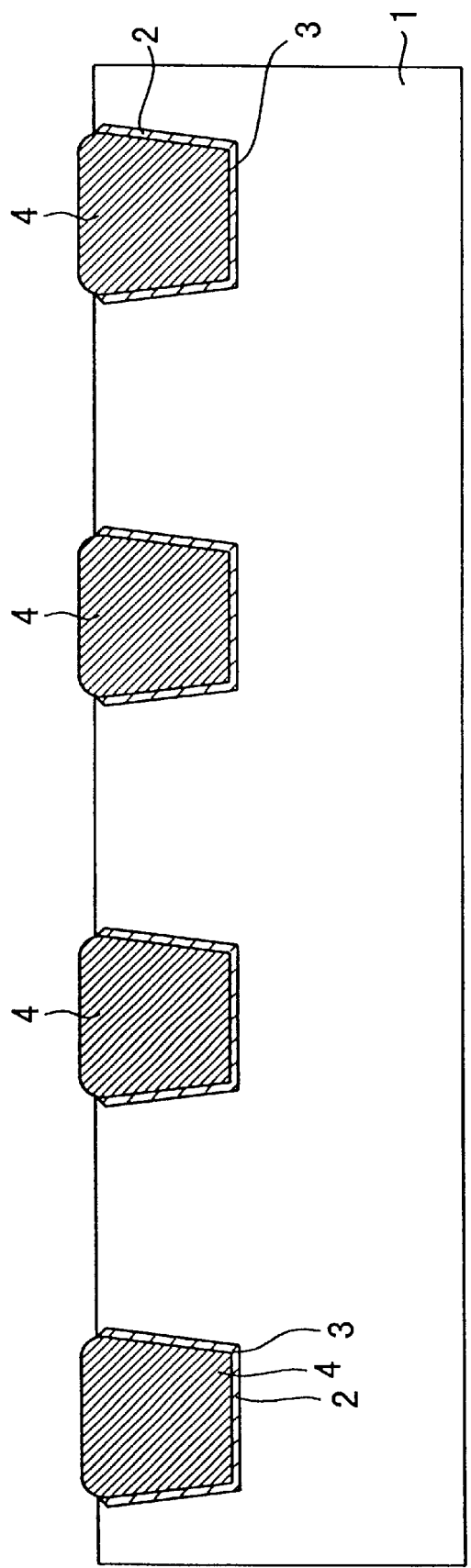

The silicon oxide film 4 is formed over the entire surface of the semiconductor substrate 1 to a thickness of about 300 to 800 nm by means of low-pressure CVD. The silicon oxide film 4 is eliminated from the surface of the silicon nitride film 32 by means of chemical-mechanical polishing (CMP) while the silicon nitride film 32 is used as a stopper, thereby leaving the silicon oxide film 4 in only the inside of the openings formed from the trenches 2 and the silicon nitride film 32. Subsequently, after the silicon nitride film 32 has been removed through wet etching through use of hot phosphoric acid, the silicon oxide film 31 is removed, thus constituting a trench isolation structure. FIG. 4 is a cross-sectional view showing the semiconductor device after completion of the foregoing manufacturing step.

The gate oxide film 5 is formed over the entire surface of the semiconductor substrate 1 to a thickness of about 7 to 10 nm through thermal oxidation, and a polysilicon layer is formed over the entire surface of the semiconductor substrate 1 to a thickness of about 150 to 300 nm by CVD. A phosphorous or arsenic is implanted into the semiconductor substrate 1 at an energy of 10 to 40 keV and a dose of about $2\times10^{15}/cm^2$ to $10\times10^{15}/cm^2$, through use of a photoresist mask whose openings correspond to the positions of the n-MOS regions of the logic circuit and the DRAM memory cell, thereby introducing impurities to the polysilicon layer 6 of the n-MOS region. Further, a boron or boron fluoride is implanted into the semiconductor substrate 1 at an energy of 10 to 40 keV and a dose of about $2\times10^{15}/cm^2$ to $10\times10^{15}/cm^2$, through use of a photoresist mask whose openings correspond to the positions of the p-MOS regions of the logic circuit and the DRAM memory cell, thereby introducing impurities into the polysilicon layer 6 of the p-MOS region. In this case, ion implantation of the p-MOS region and ion implantation of the n-MOS region are performed according to an arbitrary sequence. The semiconductor substrate 1 is patterned through anisotropic etching by use of a photoresist mask (not shown), thereby forming the polysilicon layer 6 which is to act as a gate electrode.

Figure 5:
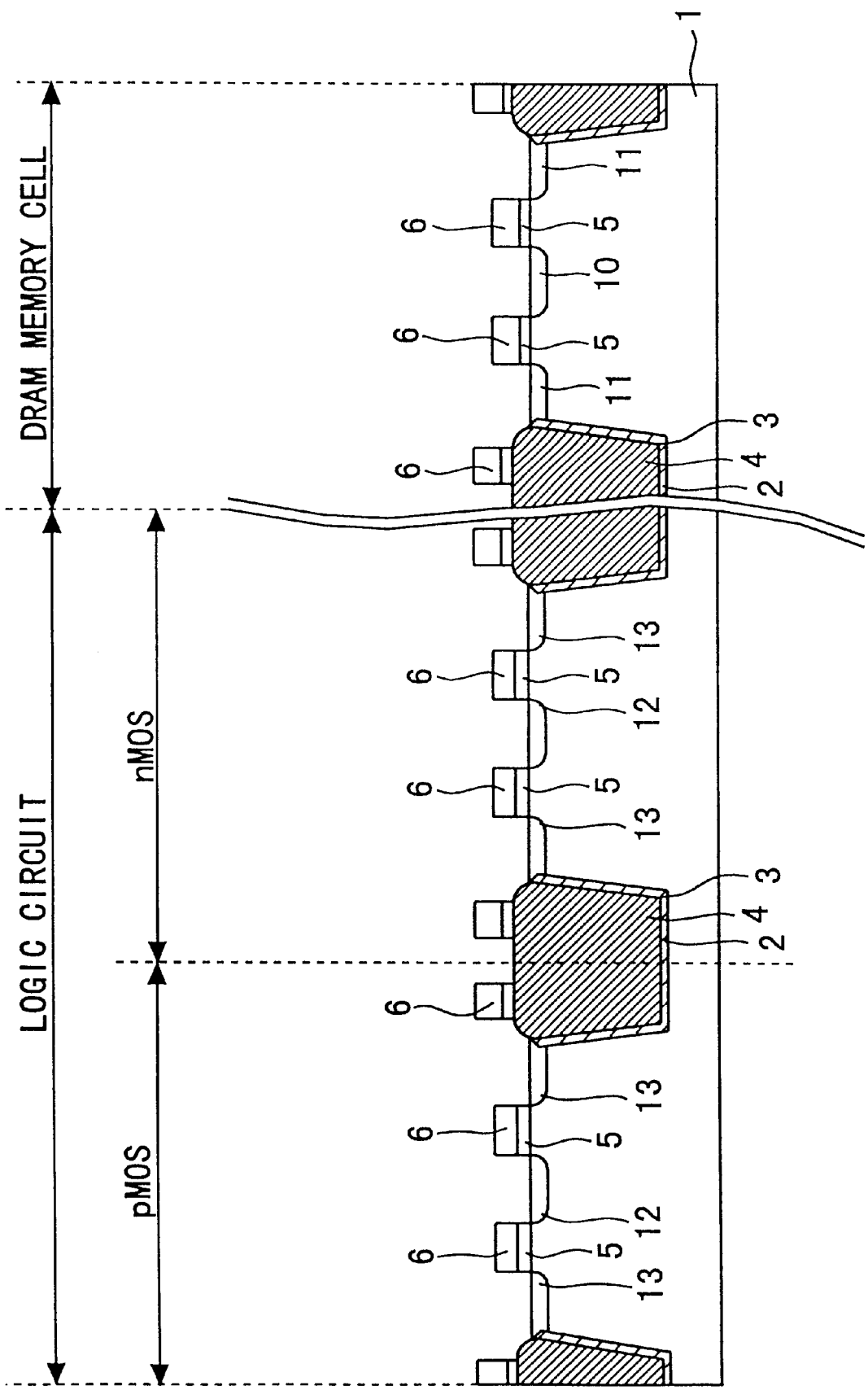

A phosphorous or arsenic implant is implanted into the n-MOS regions at an energy of 20 to 40 keV and a dose of about $1\times10^{13}/cm^2$ to $3\times10^{13}/cm^2$, through use of a photoresist mask, and a boron or boron fluoride is implanted into the p-MOS regions at an energy of 20 to 40 keV and a dose of about $1\times10^{13}/cm^2$ to $3\times10^{13}/cm^2$, through use of the photoresist mask, thereby forming the source/drain regions 10 to 13. FIG. 5 is a cross-sectional view showing the semiconductor device after completion of the foregoing manufacturing step.

In a case where an channel implanted layer (not shown) or a well (not shown) is formed, after formation of trench isolation structures, a thermal oxide film (not shown) which is to act as a protective film against ion implantation is formed over the entire surface of the semiconductor substrate 1 before formation of the gate oxide film 5. After formation of the thermal oxide film, the channel implanted layer or the well is formed by means of ion implantation. When an n-well is formed in an n-MOS region, boron or boron fluoride is implanted into the semiconductor substrate 1 by means of ion implantation, through use of a photoresist mask whose openings correspond to the positions of the n-MOS regions. When a p-well is formed in a p-MOS region, phosphorous or arsenic is implanted into the semiconductor substrate 1 by means of ion implantation, through use of a photoresist mask whose openings correspond to the positions of the p-MOS regions. In a case where channel implanted layers are formed, the implantation steps must be separated not only between for a p-MOS region and for an n-MOS region in which impurities of different polarity types are employed but also between for an n-MOS region of the logic circuit and for an n-MOS region of the DRAM because of the difference of the threshold thereof. That is, each of the channel implanted layers (not shown) is formed by performing a series of steps including the steps of preparing a photoresist mask whose openings correspond to the positions of active areas of the p-MOS region of the logic circuit; implanting phosphorous or arsenic into the semiconductor substrate 1 by means of ion implantation through use of the thus-prepared photoresist mask; forming a photoresist mask whose openings correspond to the positions of active areas of the n-MOS region of the logic circuit; implanting boron or boron fluoride into the semiconductor substrate 1 by means of ion implantation through use of the photoresist mask; forming a photoresist mask whose openings correspond to the positions of active areas of the n-MOS region of the DRAM memory cell; and implanting boron or boron fluoride into the semiconductor substrate 1 through use of the photoresist mask. At this time, the implanted channel layer formed in the n-MOS region of the logic circuit and the implanted channel layer formed in the n-MOS region of the DRAM memory cell are formed from impurities of the same type. However, the impurities are implanted into these implanted channel layers under different conditions, and hence they are formed separately.

The present embodiment describes a case where a single threshold value is assigned to each of the n-MOS transistor and the p-MOS transistor of the logic circuit section. If different threshold values are required to at least one of the n-MOS and p-MOS regions, channel doping must be repeated while different masks are employed according to the conductivity type of the implanted channel layer and the threshold values. Further, ion implantation for the purpose of forming a well may be performed simultaneously with formation of an implanted channel layer, as required. It is be noted that the thermal oxide film formed at the time of channel doping or well doping is eliminated by hydrofluoric acid before formation of the gate oxide film 5.

Figure 6:
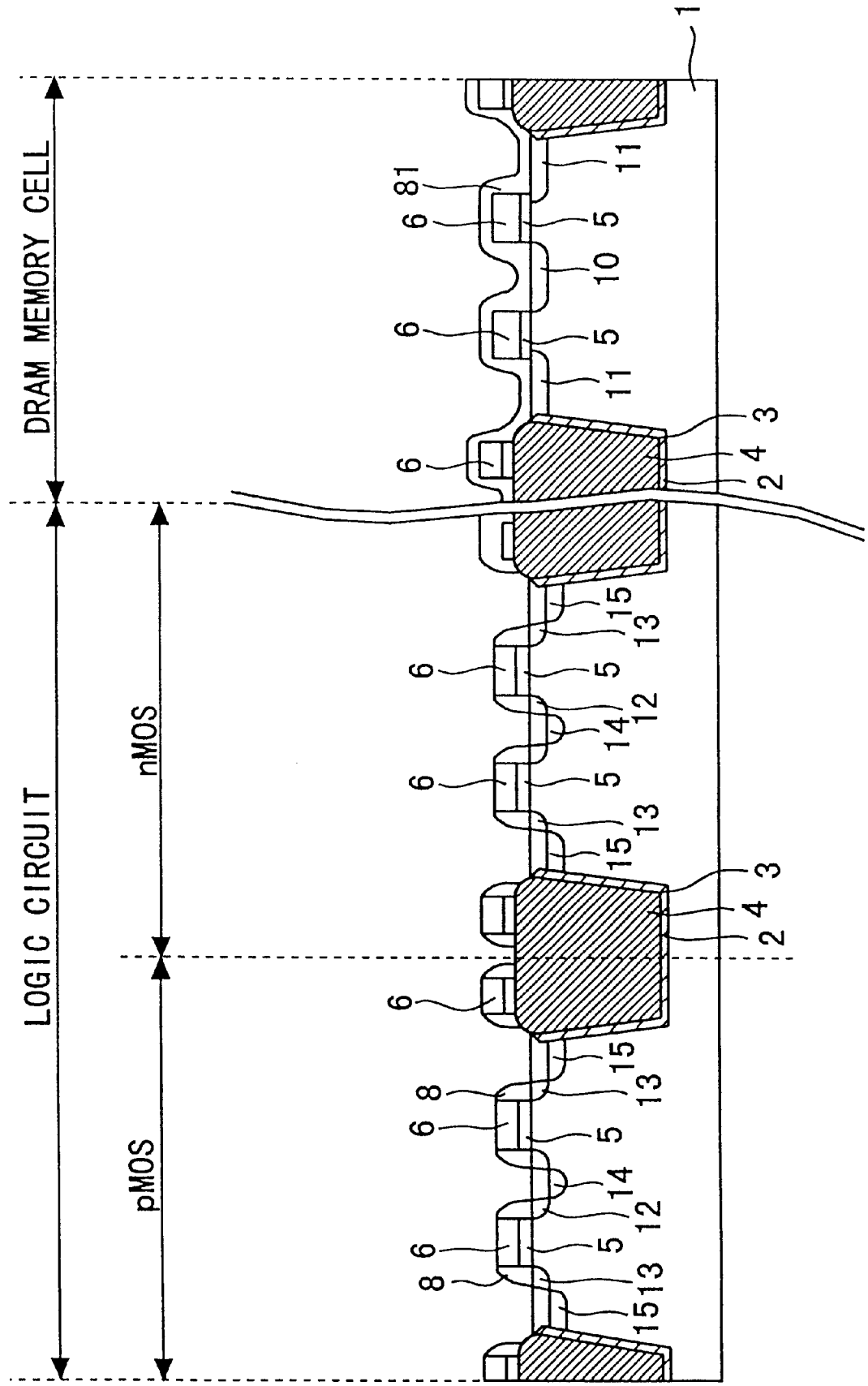

In FIG. 6, reference numeral 81 designates a silicon nitride film. The silicon nitride film 81 is deposited over the entire surface of the semiconductor substrate 1 to a thickness of about 30 to 100 nm by means of CVD. The silicon nitride film 81 is etched back through use of a photoresist film (not shown) which covers the entirety of the DRAM memory cell, thereby forming the side walls 8 in the logic circuit. Thereafter, the photoresist mask is removed. A photoresist mask (not shown) whose openings correspond to the positions of the n-MOS region of the logic circuit is prepared, and phosphorous or arsenic is implanted into the n-MOS regions at an energy of 20 to 40 keV and a dose of about $1\times10^{15}/cm^2$ to $5\times10^{15}/cm^2$, through use of the photoresist mask, to thereby form the source/drain regions 14 and 15. Similarly, aphotoresist mask (not shown) whose openings correspond to the positions of active areas of the p-MOS region of the logic circuit is prepared, and boron or boron fluoride is implanted into the p-MOS regions at an energy of 20 to 40 keV and a dose of about $1\times10^{15}/cm^2$ to $5\times10^{15}/cm^2$, through use of the photoresist mask, thereby forming the source/drain regions 14 and 15. Formation of the source/drain regions 14 and 15 in the n-MOS region and formation of the source/drain regions 14 and 15 in the p-MOS regions are performed according to an arbitrary sequence. A lightly-doped drain (LDD) structure is formed by combination of the source/drain regions 14 and 15 and the source/drain regions 12 and 13. The implanted impurities are activated by being annealed at about 800° C. to 900° C. for about 10 to 30 min. FIG. 6 is a cross-sectional view showing the semiconductor device after completion of the foregoing manufacturing step. It is be noted that a silicon nitride-oxide film (not shown) may be used in place of the silicon nitride film 81, although an etch selectivity against a silicon oxide film becomes lower than that obtained when the silicon nitride film 81 is employed.

Figure 7:
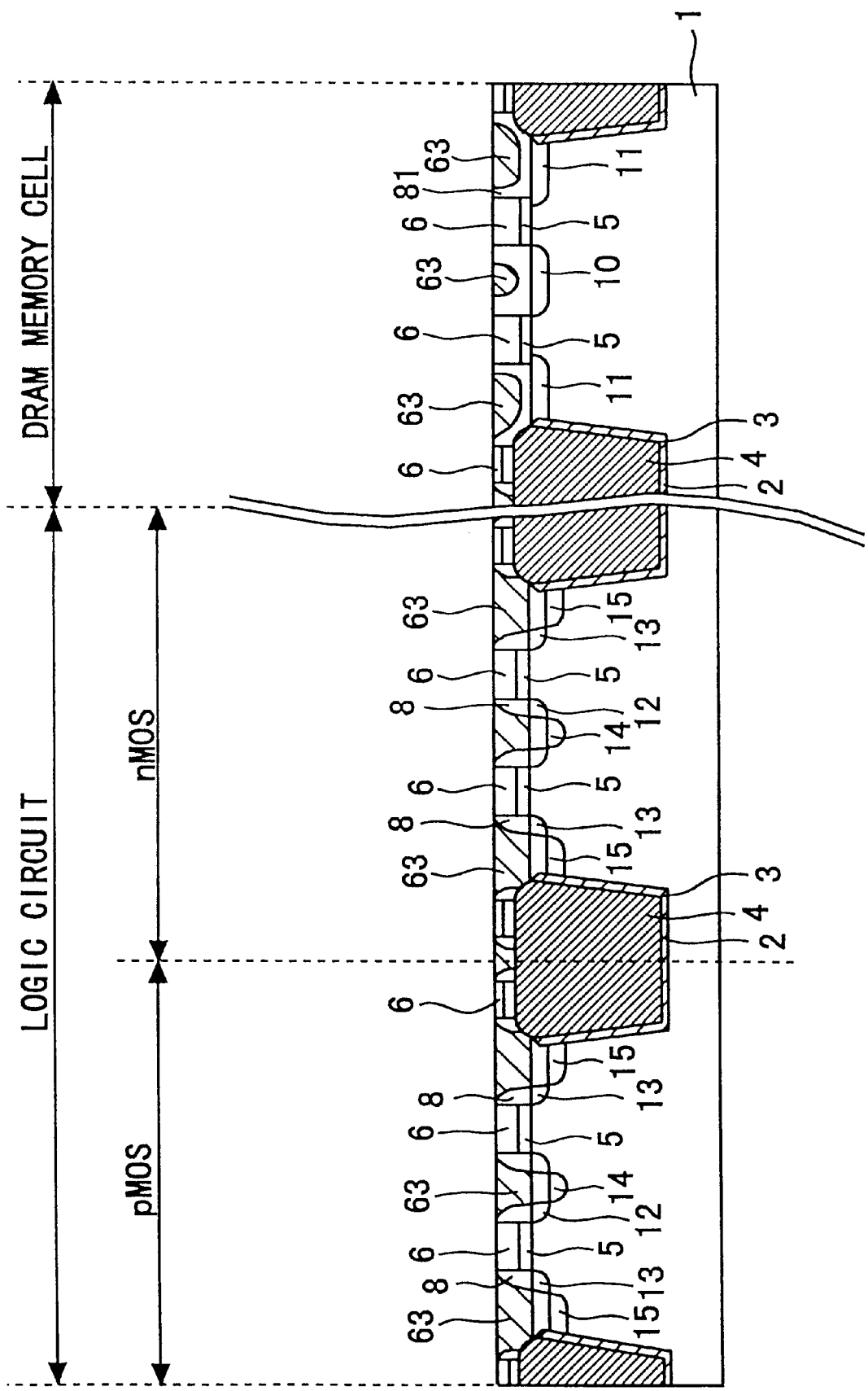

In FIG. 7, reference numeral 63 designates a silicon oxide film. As seen in FIG. 7, after the silicon oxide film 63 has been deposited on the entire surface of the semiconductor substrate 1 to a thickness of about 300 to 800 nm by means of CVD, the silicon oxide film 63 is abraded and polished by means of CMP while the polysilicon layer 6 is used as a stopper, until the surfaces of the polysilicon layer 6 of the DRAM memory cell and the polysilicon layer 6 of the logic circuit become exposed. FIG. 7 is a cross-sectional view showing the semiconductor device after completion of this manufacturing step. The remaining silicon oxide film 63 is eliminated by hydrofluoric acid. As a result, the surfaces of the source/drain regions 14 and 15 and polysilicon layer 6 of the logic circuit and the surface of the polysilicon layer 6 of the DRAM memory cell are exposed, and the source/drain regions 10 and 11 of the DRAM memory cell are covered with the silicon nitride film 81.

Figure 8:
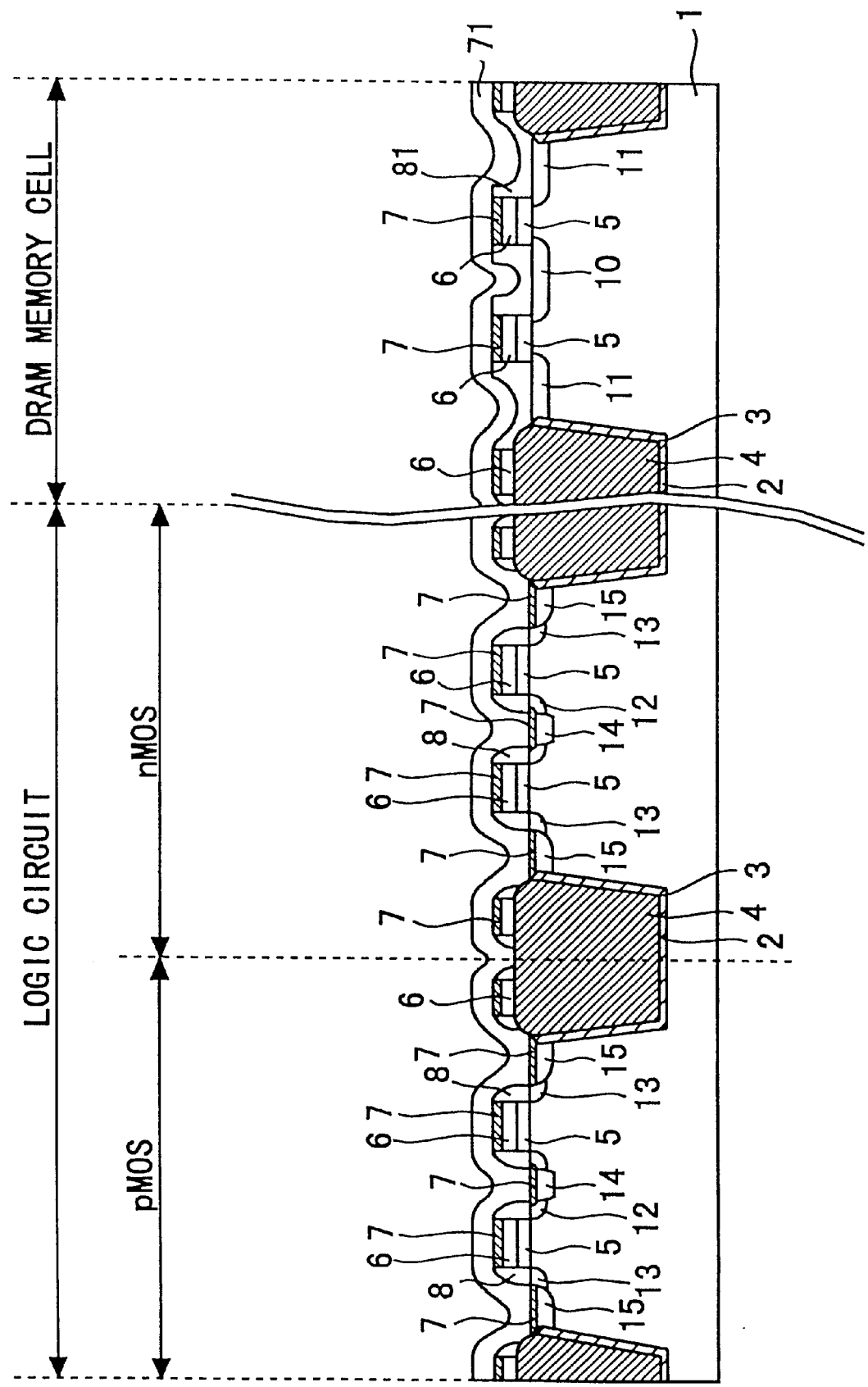

In FIG. 8, reference numeral 71 designates a metal layer. As shown in FIG. 8, metal layer 71 such as cobalt (Co) is deposited on the entire surface of the semiconductor substrate 1 to a thickness of about 10 nm by means of sputtering. The semiconductor substrate 1 is heated at about 450° C. for one to three minutes, so that the metal silicide layer 7 is formed to a thickness of about 40 to 60 nm on the surface of the polysilicon layer 6 and the surfaces of the source/drain regions 14 and 15. At this time, since the surfaces of the source/drain regions 10 and 11 are covered with the silicon nitride film 81, the metal silicide layer 7 is not formed thereon. FIG. 8 is a cross-sectional view showing the semiconductor device after completion of this manufacturing step.

After removal of the metal layer 71 that has not reacted, the semiconductor substrate 1 is annealed at a comparatively high temperature of about 900° C. for 5 to 20 seconds.

If the metal silicide layer 7 is formed at a comparatively low temperature of 450° C. as mentioned above, reaction with the side walls 8 or the silicon oxide film 4 and the metal layer 71 such as cobalt can be prevented, thus preventing formation of a metal silicide layer on areas other than the surfaces of source/drain regions and polysilicon layer 6. Accordingly, a short-circuit can be prevented from developing between the gate 9 electrode and the source/drain region. However, the electrical resistance of the thus-formed metal silicide layer becomes high in this state. For this reason, after removal of the metal layer 71 that has not reacted, the semiconductor substrate 1 is annealed at a comparatively high temperature of about 900° C. for about 5 to 20 seconds so as to change the composition of the metal silicide layer 7. As a result, the electrical resistance of the metal silicide layer 7 is reduced. Titanium (Ti), nickel (Ni), molybdenum (Mo), or tungsten (W) are capable of being employed other than cobalt includes. These metal elements have an advantage of being able to selectively react with only silicon even at a low temperature, as well as an advantage of having low electrical resistance.

The interlayer dielectric film 61 is deposited on the entire surface of the semiconductor substrate 1 to a thickness of about 200 to 600 nm. Subsequently, contact holes (not shown) are opened to a diameter of about 0.1 to 0.5 $\mu$m so as to extend to the source/drain region 10 of the DRAM memory cell, by means of dry etching. Wiring material is embedded in the contact holes by means of CVD, and the semiconductor substrate 1 is patterned, thus forming bit lines (not shown).

Figure 9:
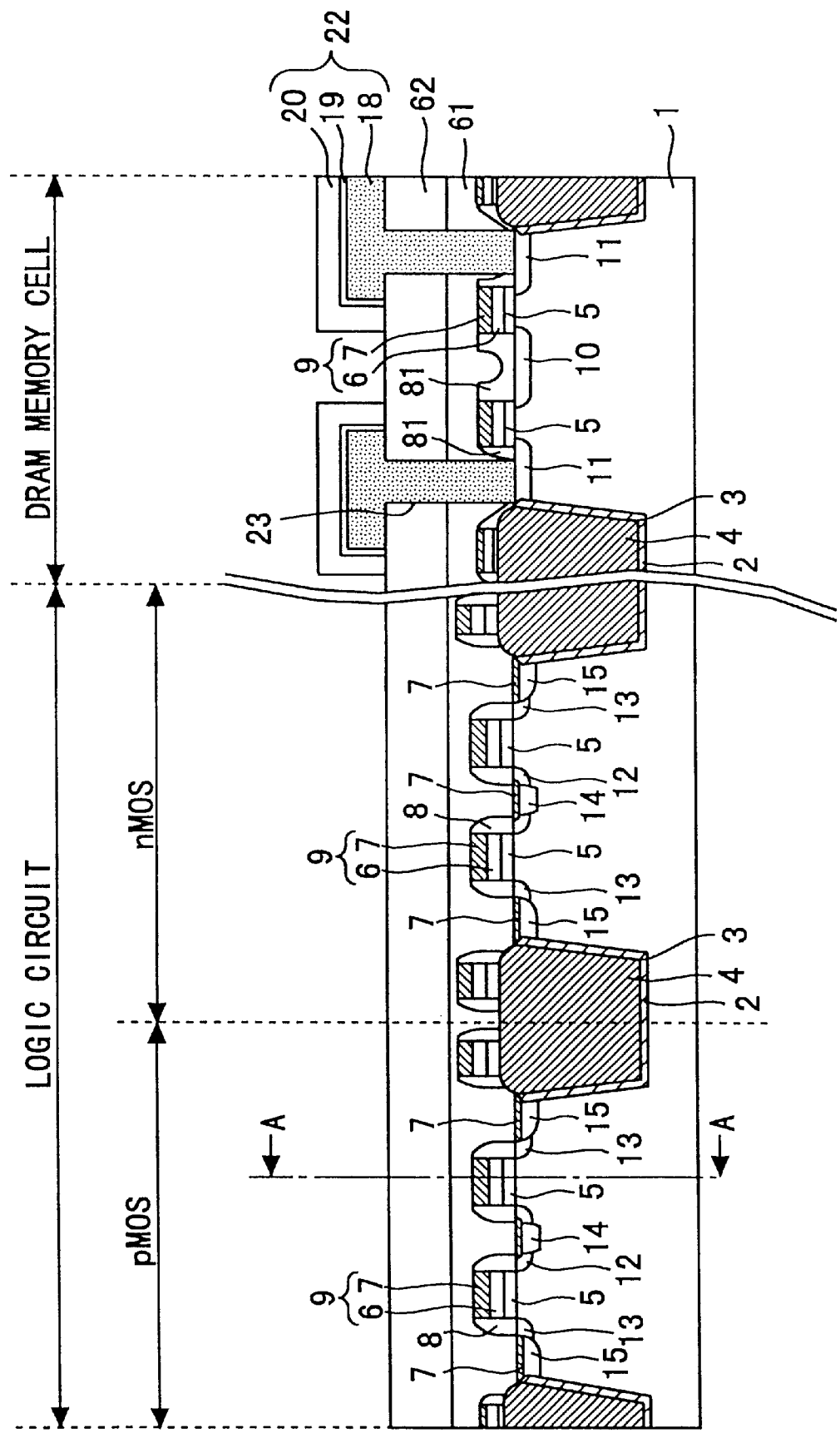

Next, after formation of the interlayer dielectric film 62 and the contact hole 23, polycrystalline silicon doped with impurities, such as phosphorous, at a concentration of about $1\times10^{20}$ to $5\times10^{20}/cm^3$ is deposited on the entire surface of the semiconductor substrate 1 to a thickness of about 600 to 1000 nm. The polycrystalline silicon doped with impurities is patterned so as to remain only on a predetermined region, thus forming the storage node 18. A silicon nitride film which is to act as the capacitor dielectric film 19 is deposited to a thickness of about 5 to 10 nm by means of CVD. Further, polycrystalline silicon which is to act as the cell plate 20 and contains impurities, such as phosphorous, at a concentration of about $1\times10^{20}$ to $5\times10^{20}/cm^3$ is deposited on the capacitor dielectric film 19 to a thickness of about 50 to 100 nm. The cell plate 20 is patterned so that the capacitor 22 is formed. FIG. 9 is a cross-sectional view showing the semiconductor device after completion of this manufacturing step. In the case of a trench-type capacitor, the capacitor is fabricated during the course of formation of trench isolation structures or after completion of the trench isolation structures before formation of a transistor.

After formation of the interlayer dielectric film 65, contact holes are formed so as to extend to the gate electrode, the cell plate, and the source/drain regions which locate other than the DRAM memory cell by performing dry etching. Wiring material is embedded into the contact holes, and patterned according to circuit configuration as required, thus forming a wiring layer. Through the foregoing manufacturing steps, the semiconductor device shown in FIG. 1 is fabricated. Although FIG. 1 shows only the contact hole 16 extending to the source/drain regions 12 and 14 of the p-MOS region of the logic circuit and the wiring pattern 17 connected to the source/drain regions 12 and 14 by way of the contact hole 16, wiring layers are formed so as to connect with the other source/drain regions 12 through 15, the gate electrodes 9, and the cell plates 20 by way of contact holes (not shown). The respective contact holes or wiring layers may be formed in different processes, as required, or may be formed before or after formation of the capacitor or the bit lines. Further, other interlayer dielectric film and wiring layers are formed in upper levels, as required, thus forming multi-layer wiring.

Figure 10:
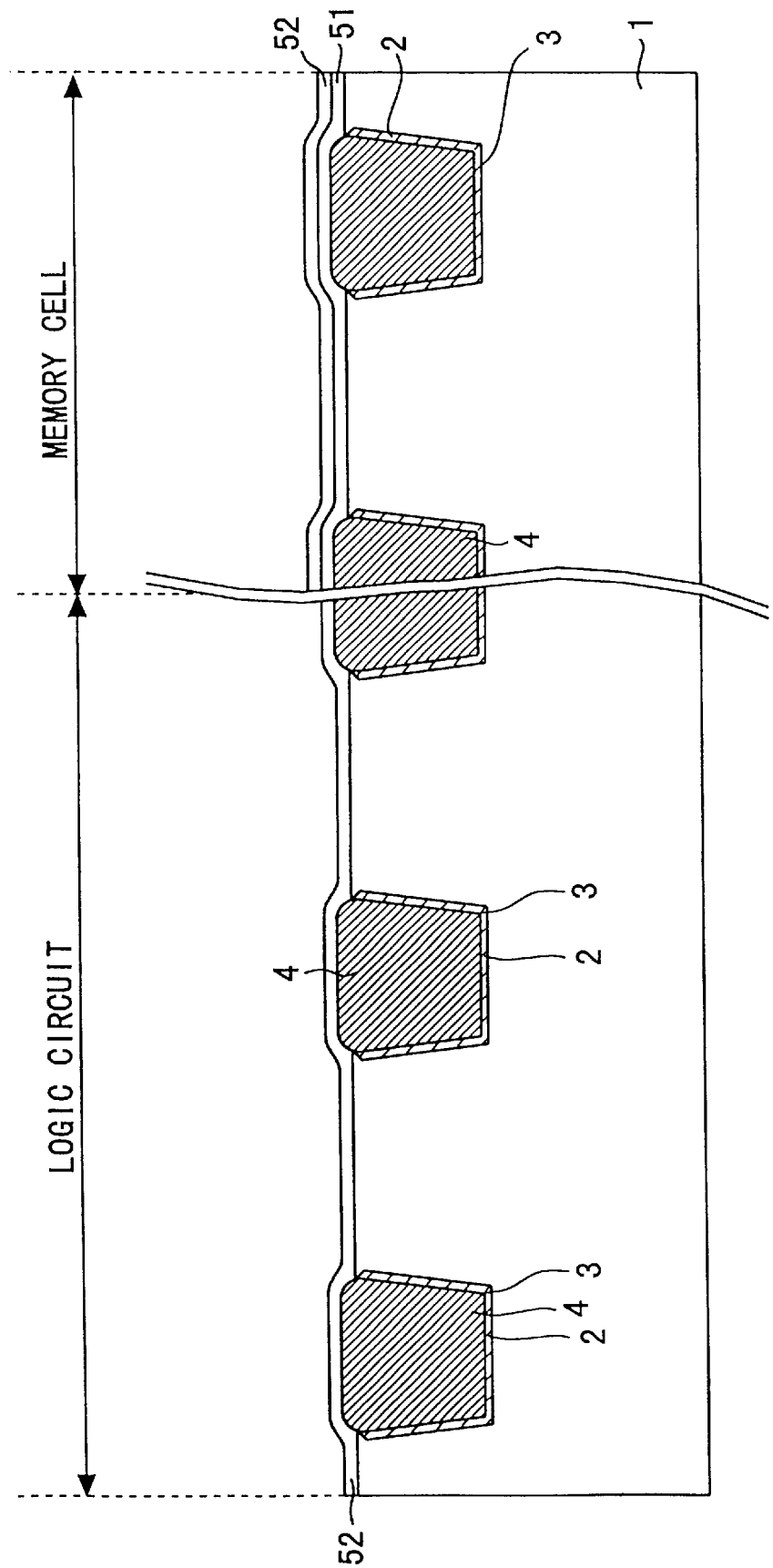

FIG. 10 is a cross-sectional view showing a process for manufacturing the semiconductor device according to the first embodiment, for the purpose of describing manufacture of a semiconductor device, wherein the gate oxide film formed in the logic circuit differs in thickness from that formed in the DRAM memory cell. In the drawing, reference numerals 51 and 52 designate a silicon oxide film.

In a case where an attempt is made to improve the performance (or processing speed) of the logic circuit through use of a dual oxide structure in which the gate oxide film formed in the logic circuit is smaller in thickness than that formed in the DRAM memory cell, trench isolation structures are formed first as shown in FIG. 4; then an implanted channel layer (not shown) or a well (not shown) is formed after formation of the trench isolation structures. A silicon oxide film 51 is formed on the surface of the exposed semiconductor substrate 1 to a thickness of about 3 to 7 nm. A photoresist mask (not shown) is formed such that an opening corresponds to the position of the logic circuit region on the silicon oxide film 51. The silicon oxide film 51 is removed from the logic circuit region using the photoresist mask. After removal of the photoresist mask, the silicon oxide film 52 is formed again on the entire surface of the semiconductor substrate 1 to a thickness of about 3 to 7 nm. In the structure described above, the gate oxide film 5 within the logic circuit region is formed from the silicon oxide film 52, and the gate oxide film 5 of the DRAM memory cell is formed from the silicon oxide films 51 and 52. FIG. 10 is a cross-sectional view showing the elements of the semiconductor device after completion of this manufacturing step. The semiconductor device is subjected to subsequent processing steps which are identical with those used manufacturing the semiconductor device whose gate oxide film in the logic circuit is equal thickness with that in the DRAM memory cell.

Figure 21:
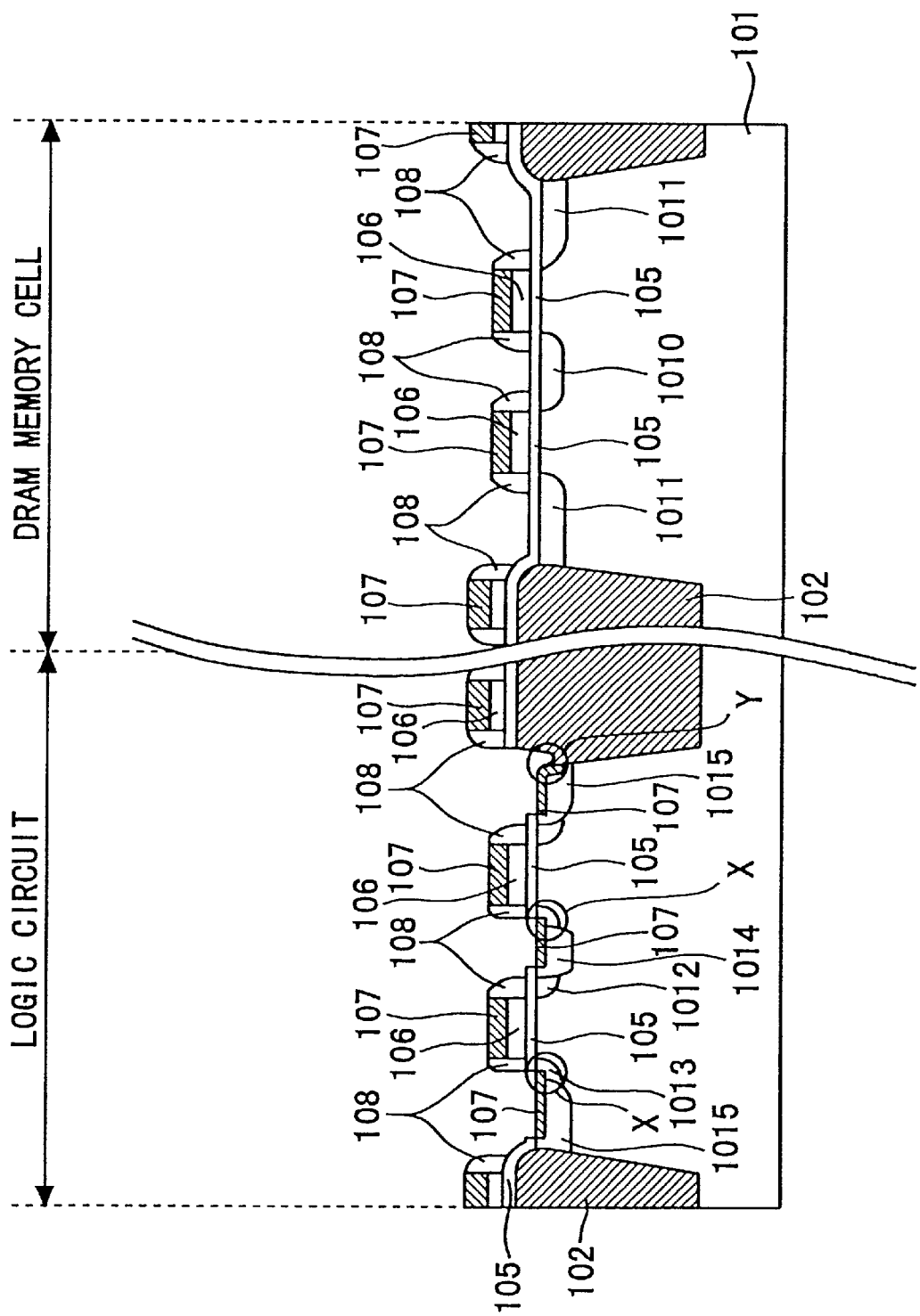
Figure 22:
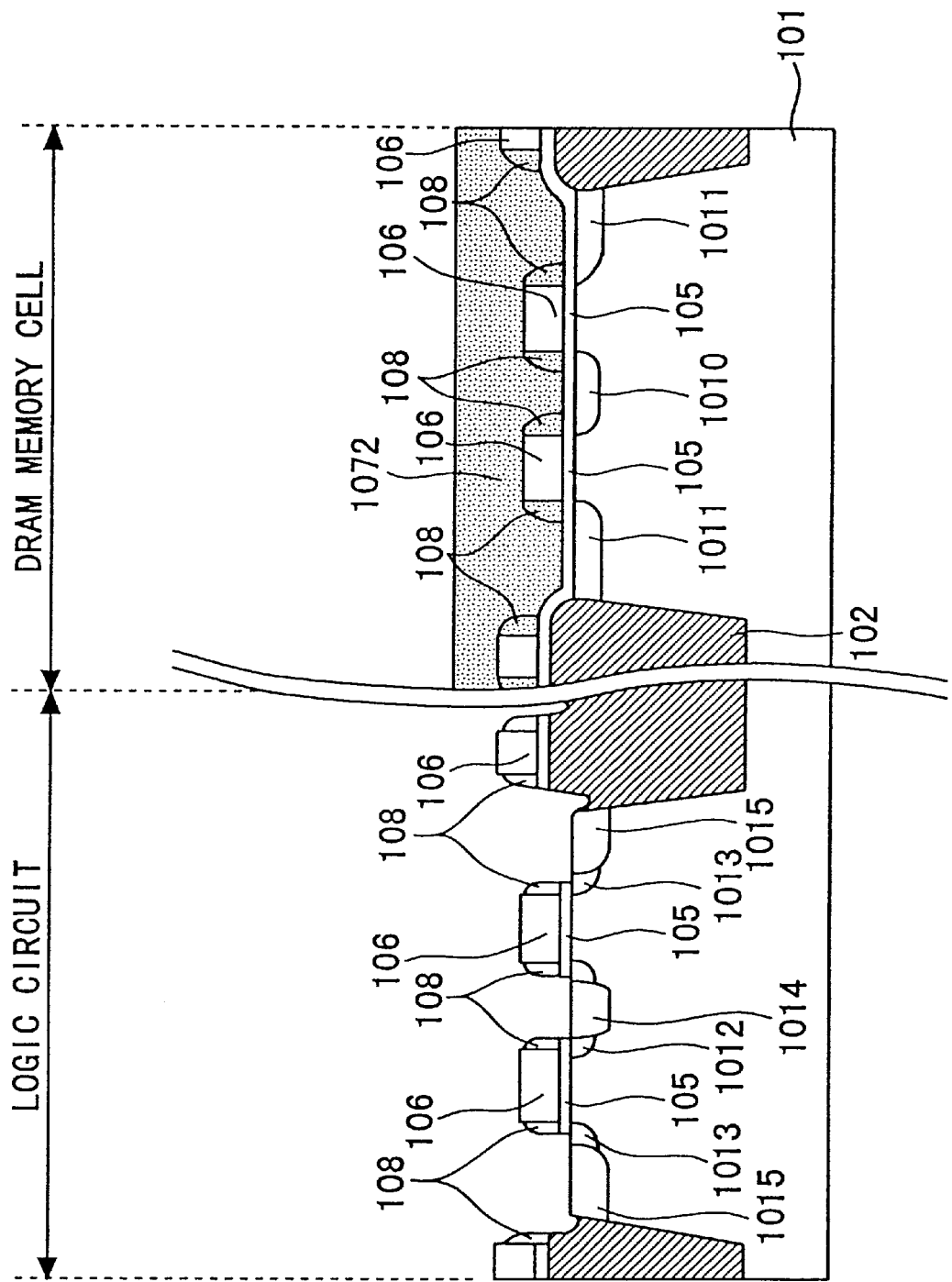

According to the first embodiment, a polysilicon layer which acts as a gate electrode of the DRAM memory cell and a gate electrode of the logic circuit has been patterned on a single semiconductor substrate. On the polysilicon layer are formed the silicon nitride film 81 and the silicon oxide film 63 which are smoothed by means of the CMP technique. Further, before the formation of the metal silicide layer by means of the salicide technique, there is achieved a state in which the surfaces of the polysilicon layer which act as the source/drain regions and the gate electrode of the logic circuit and the surface of the polysilicon layer which acts as the gate electrode of the DRAM memory cell are exposed, while the surfaces of the source/drain regions of the DRAM memory cell are covered with the silicon nitride film 81. As a result, a metal silicide layer is formed on the gate electrode of the DRAM memory cell and the gate electrode and source/drain regions of the logic circuit. In contrast, no metal silicide layer is formed on the source/drain region of the DRAM memory cell. Accordingly, the present embodiment enables an appropriate formation of the metal silicide layer without arising the problems shown in FIGS. 21 and 22. Thus, a junction leakage current between the source/drain regions 12 and 13 and the semiconductor substrate 1, and that between the metal silicide layer formed on the source/drain region 15 and the semiconductor substrate 1 are efficiently suppressed. Further, in the semiconductor device according to the first embodiment, since the gate electrodes of the DRAM memory cell and the gate electrodes and the source/drain regions of the logic circuit are covered with the metal silicide which is formed by means of the salicide technique, the electrical resistance thereof is reduced so that a delay in the logic circuit and a delay in the DRAM memory cell are prevented. Moreover, since no silicide layer is formed on the surfaces of the source/drain regions of the DRAM memory cell, development of a leakage current from the capacitor is prevented, thus achieving improved refresh characteristics. As described above, through use of the first embodiment, there can be obtained a semiconductor device which has a high reliability while operating with a low power consumption. Further, according to the first embodiment, since a plurality of integrated circuits are assembled into a single chip, it is possible to improve the performance and processing speed of the semiconductor device.

Second Embodiment

Figure 11:
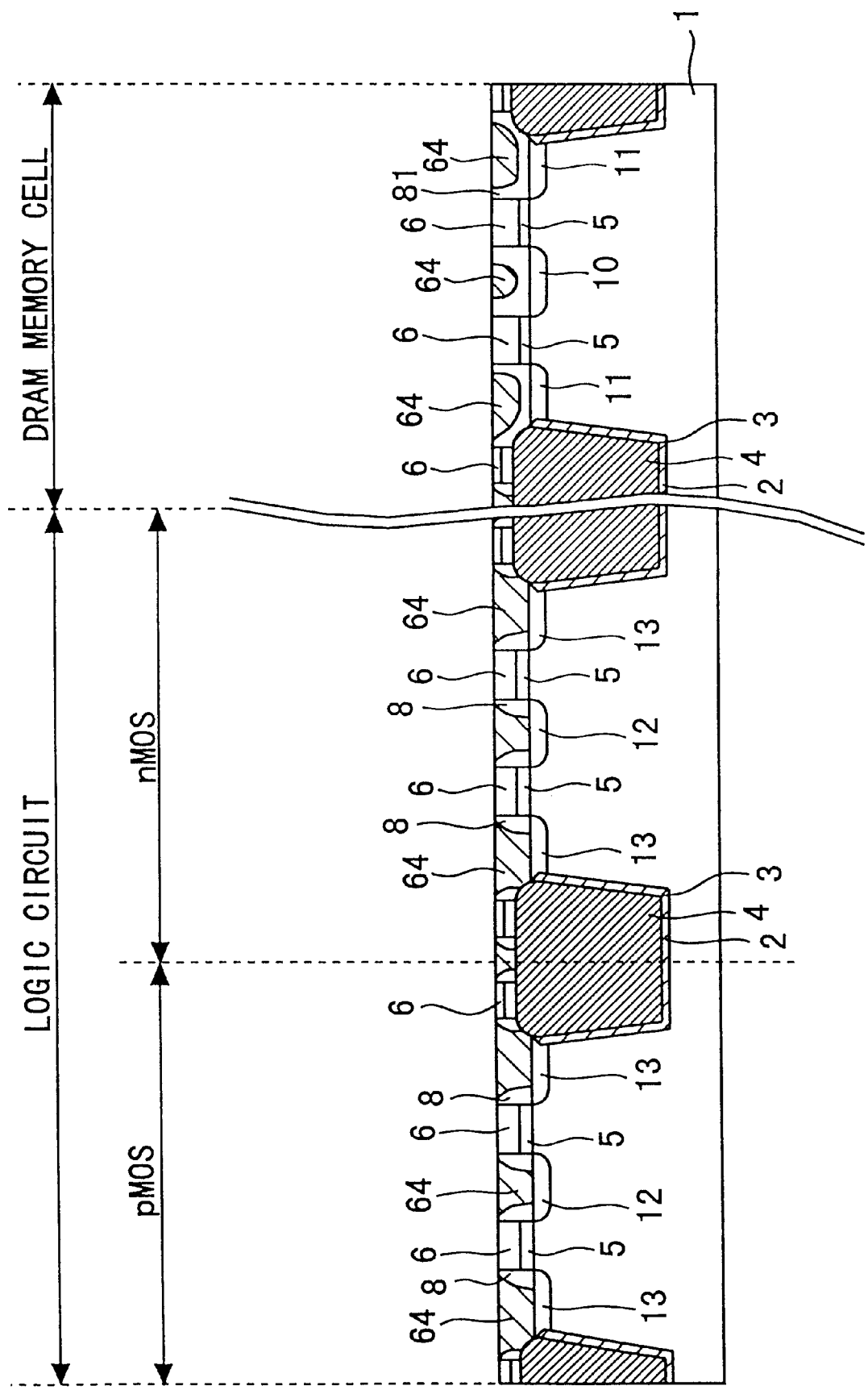
FIGS. 11 to 14 are cross-sectional views for describing a manufacturing method of a semiconductor device according to a second embodiment of the present invention.

FIG. 11 is a cross-sectional view showing a process for manufacturing a semiconductor device according to a second embodiment of the present invention, which differs from the method by which the semiconductor device shown in FIG. 1 is manufactured. In FIG. 11, reference numeral 64 designates a borophosphosilicate glass (BPSG) film.

First, as in the case of the first embodiment, the trench isolation structures, the source/drain regions 10 through 15, the polysilicon layer 6, the silicon nitride film 81, and the side walls 8 are formed on the surface of the semiconductor substrate 1. After a BPSG film 64 has been deposited on the entire surface of the semiconductor substrate 1 to a thickness of about 300 to 800 nm by means of CVD, the BPSG film 64 is abraded and smoothed by means of the CMP technique while the polysilicon layer 6 is used as a stopper, until the surface of the polysilicon layer 6 is exposed. FIG. 11 is a cross-sectional view showing the semiconductor device after completion of this manufacturing step. The remaining BPSG film 64 is selectively eliminated through use of vapor-phase hydrogen fluoride. In other respects, the semiconductor device manufacturing method according to the second embodiment is identical with that described in connection with the first embodiment.

Figure 12:
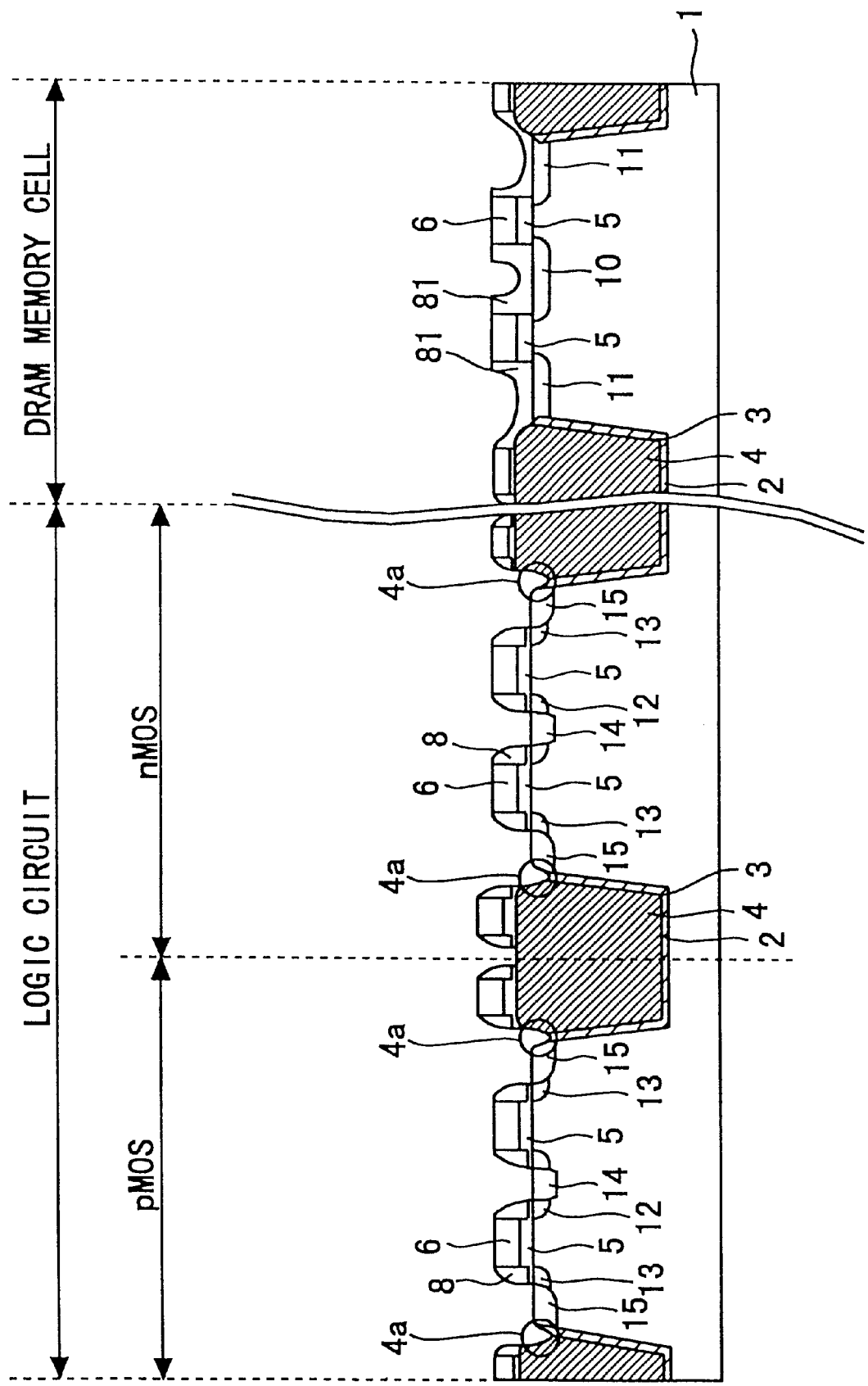
Figure 13:
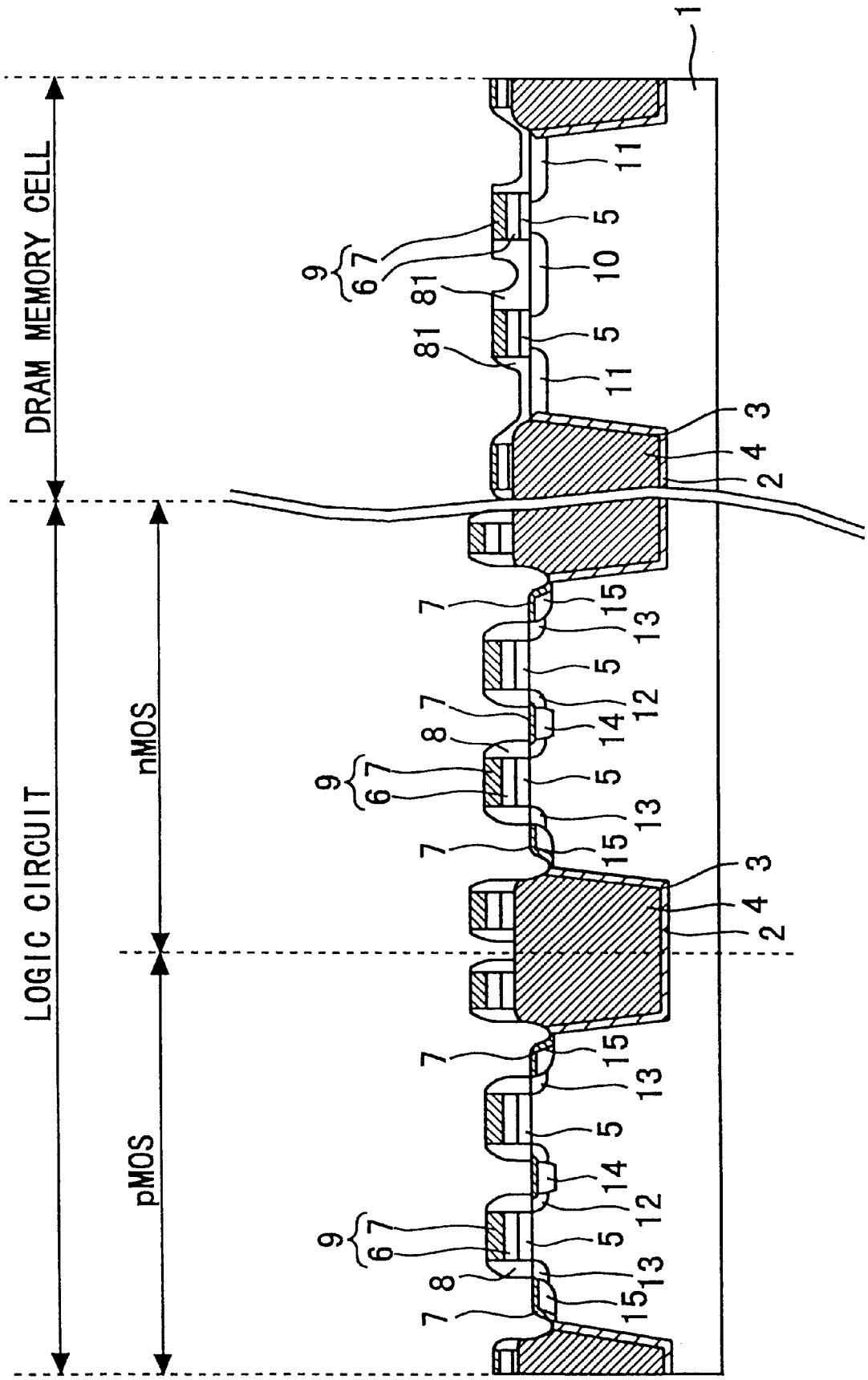
Figure 14:
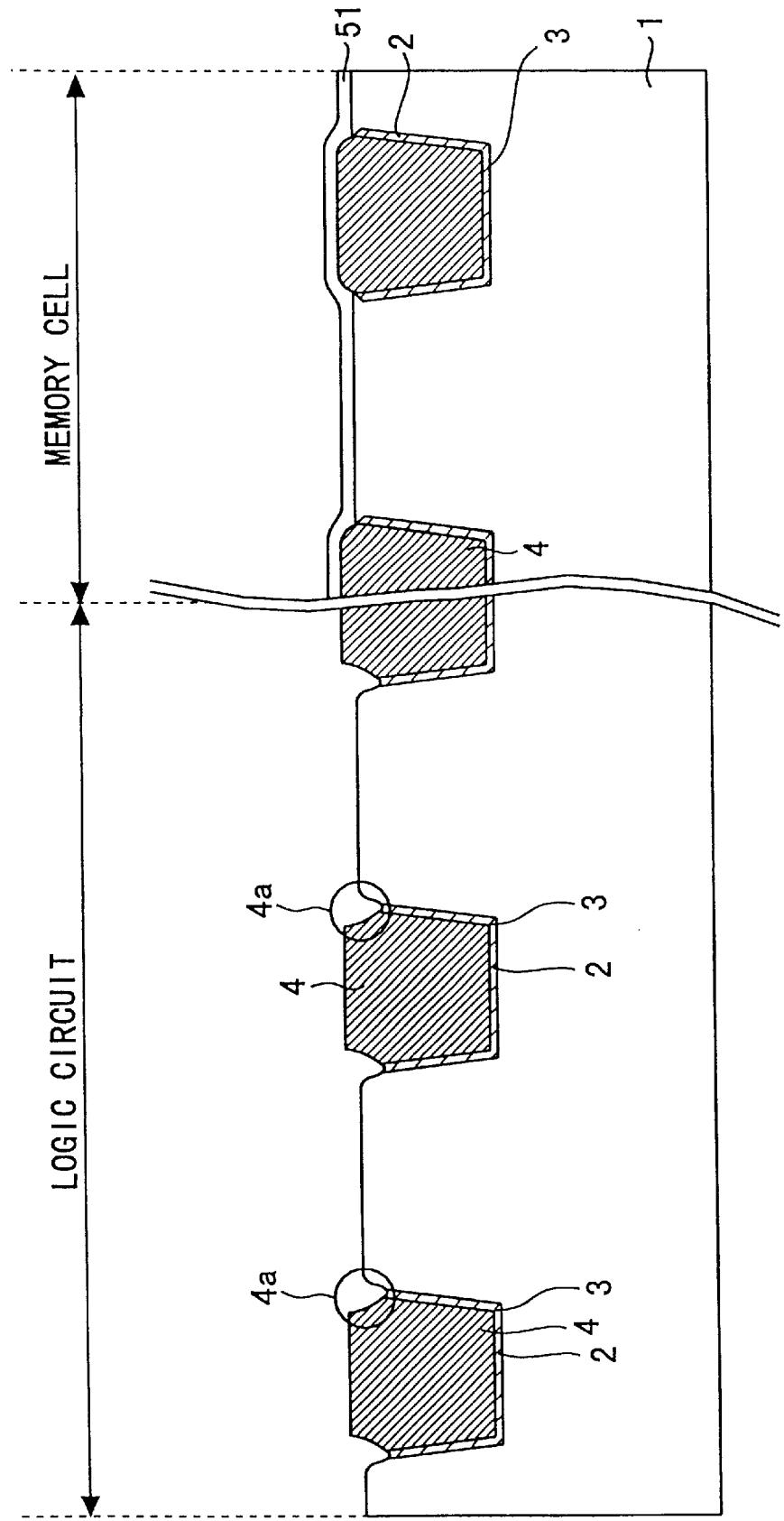

FIGS. 12 through 14 are cross-sectional views showing a manufacturing process for the semiconductor device according to the second embodiment. Under the method of manufacturing the semiconductor device according to the first embodiment, as shown in FIG. 7, when the remaining silicon oxide film 63 is eliminated through use of hydrofluoric acid after the silicon oxide film 63 has been smoothed, a portion uncovered by the silicon nitride film 81 of the silicon oxide film 4 embedded in the trenches 2 of the trench isolation structures may be etched away, which in turn would cause formation of recesses 4a such as those shown in FIG. 12. The reason for this is that the silicon oxide film 4 embedded in the trenches 2 is of the same material as the silicon oxide film 63, thus failing to ensure sufficient etch selectivity between them with regard to hydrofluoric acid. In the event of occurrence of such recesses 4a, as shown in FIG. 13, the metal silicide layer 7 formed on the surfaces of the source/drain regions 12 through 15 of the logic circuit is extended to the p-n junction formed at the boundary between the source/drain region and the semiconductor device 1, which in turn would cause a leakage current to flow.

Further, when an attempt is made in which the gate oxide film of the logic circuit is made thinner than that of the DRAM memory cell as shown in FIG. 10 corresponding to the first embodiment, the silicon oxide film 51 formed over the entire surface of the semiconductor substrate 1 is once removed from only the logic circuit region, and the silicon oxide film 52 is again formed over the entire surface of the semiconductor substrate 1. During the removal process of the silicon oxide film 51, as shown in FIG. 14, the silicon oxide film 4 which is of the same material as that of the silicon oxide film 51 may also be recessed along the edge of the trenches 2 in the boundary region between the trenches 2 and the active regions within the logic circuit region. If recesses 4a are formed in such a manner, the metal silicide layer 7 formed on the surfaces of the source/drain regions 12 through 15 of the logic circuit is extended to the p-n junction between the source/drain regions and the semiconductor substrate 1, thus increasing the probability of a leakage current flowing.

In contrast, the method of manufacturing the semiconductor device according to the second embodiment yields the same advantage as that yielded by the semiconductor device manufacturing method according to the first embodiment, as well as an advantage of improving the reliability of the semiconductor device and realizing a high yield without involvement of a risk of electrical conduction between the metal silicide layer 7 and the semiconductor substrate 1, by depositing the BPSG film 64 in place of the silicon oxide film 63 used in the first embodiment, and by selectively removing the remaining BPSG film 64 through use of vapor-phase hydrofluoric acid after the CMP process, to thereby ensure sufficient etch selectivity of the silicon oxide film 4 and the BPSG film 64 with respect to the vapor-phase hydrofluoric acid.

Third Embodiment

Figure 15:
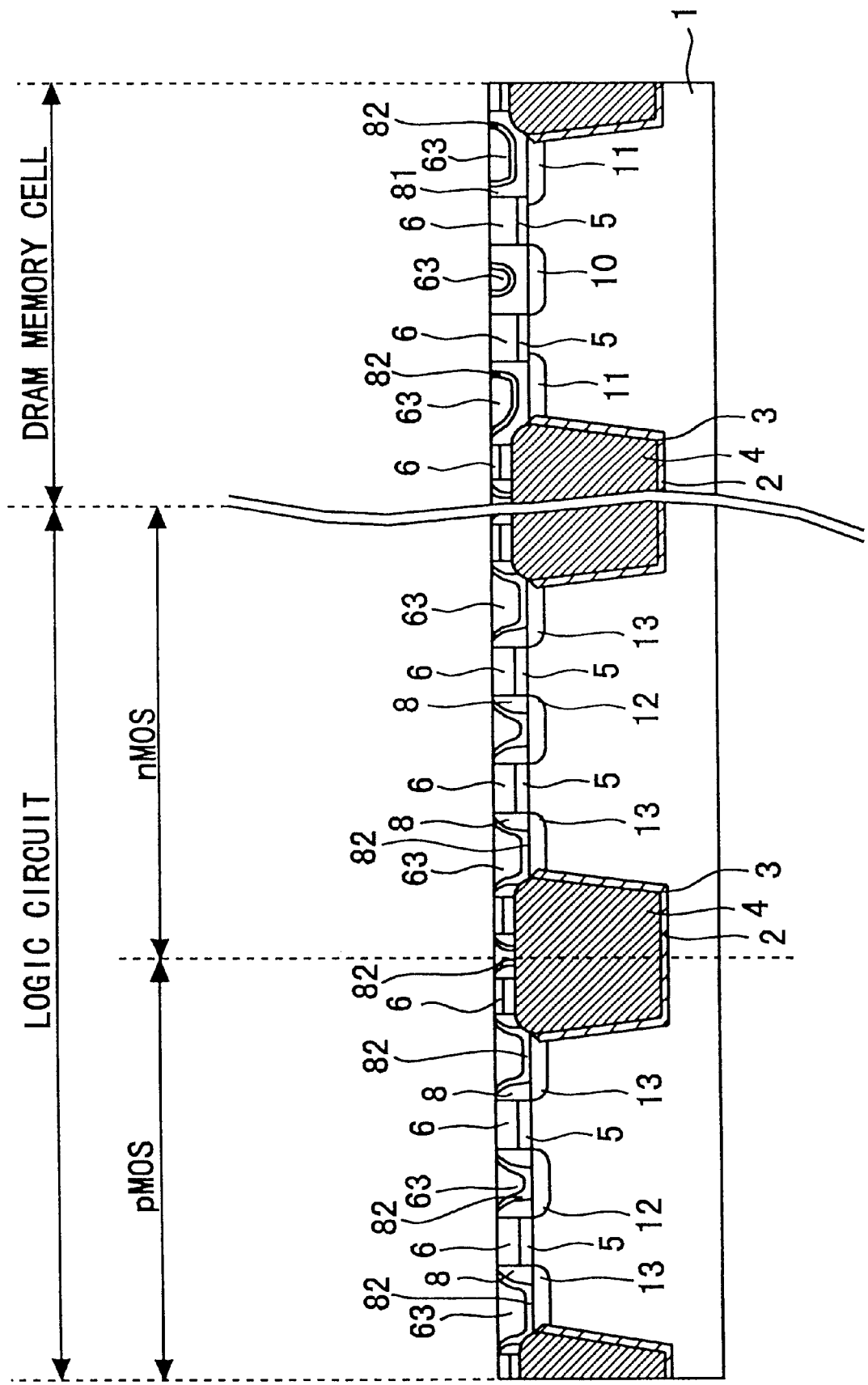
FIGS. 15 and 16 are cross-sectional views for describing a manufacturing method of a semiconductor device according to a third embodiment of the present invention.
Figure 16:
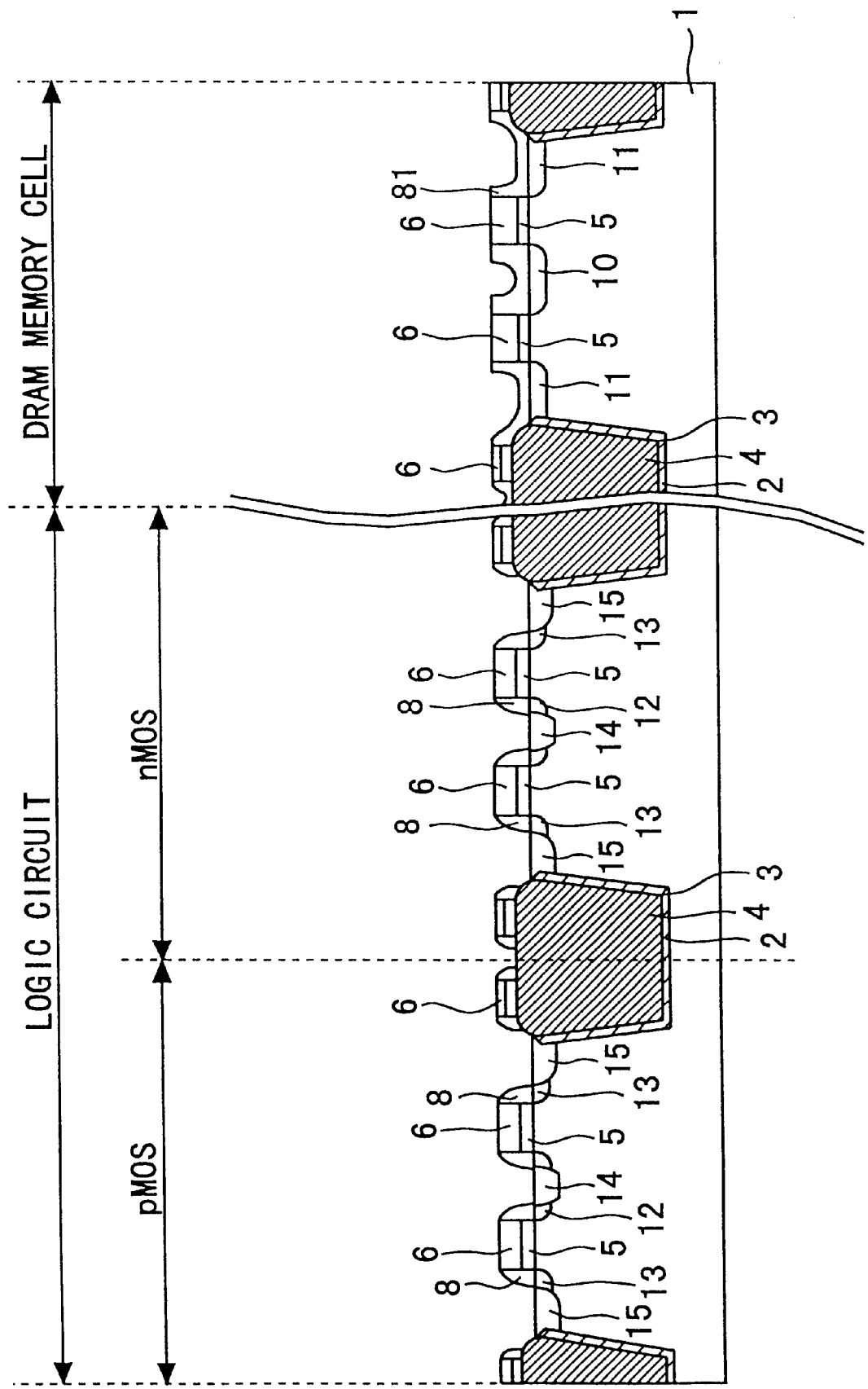
Figure 17:
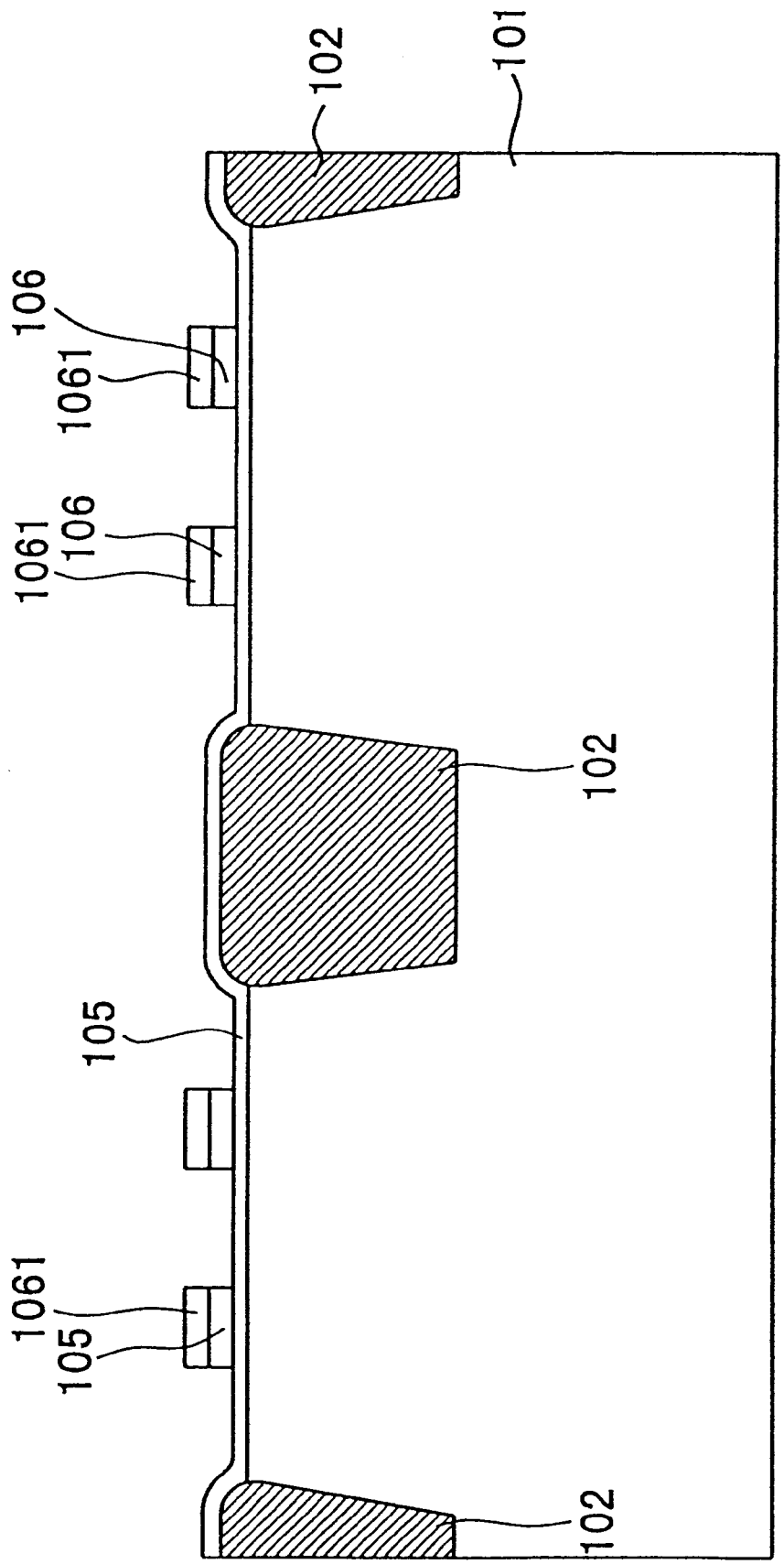
FIGS. 17 to 22 are cross-sectional views for describing a manufacturing method of a conventional semiconductor device.
Figure 18:
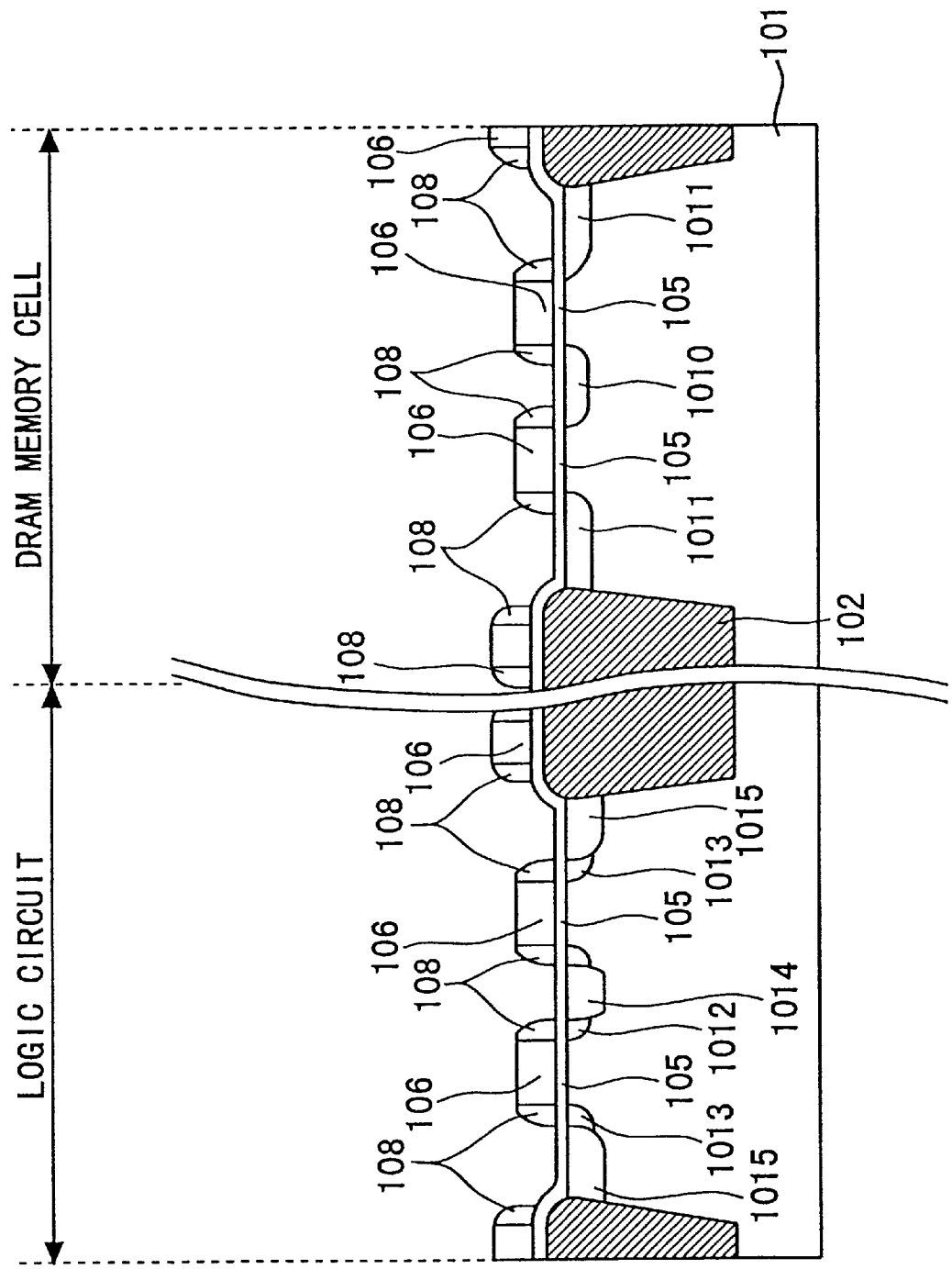
Figure 19:
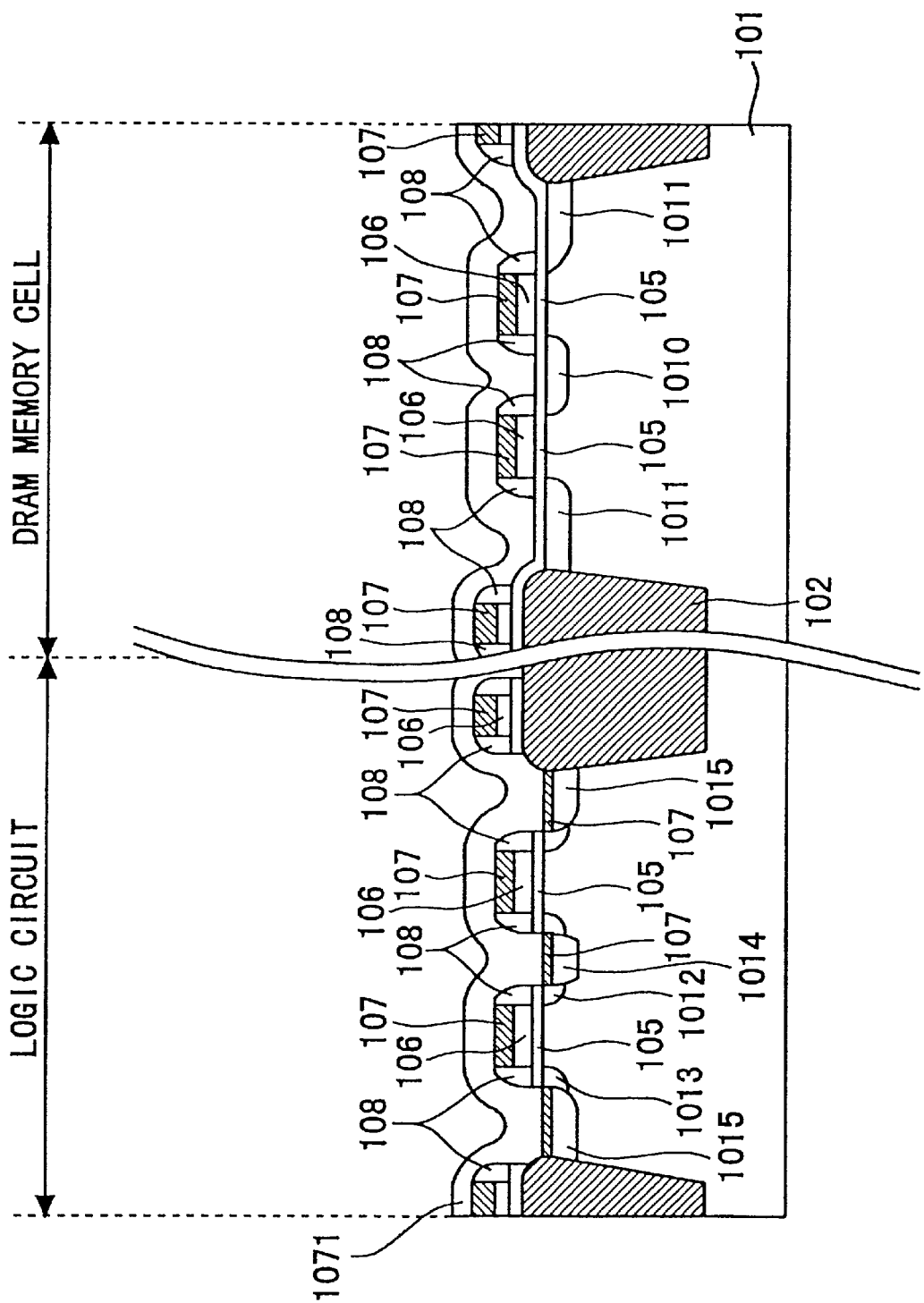
Figure 20:
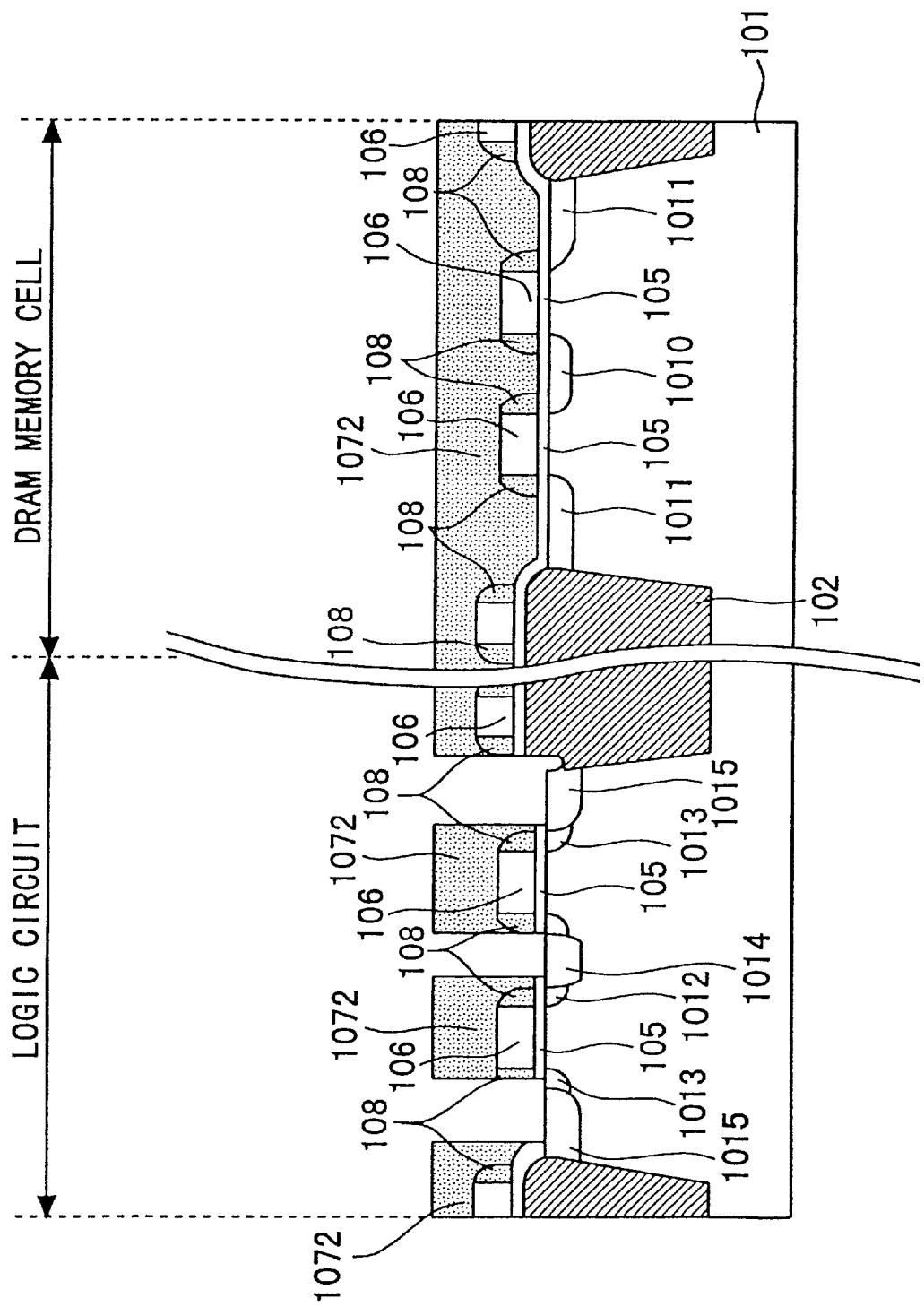

FIGS. 15 and 16 show a process for manufacturing a semiconductor device according to a third embodiment of the present invention, which also differs from the method by which the semiconductor device shown in FIG. 1 is manufactured. In the drawings, reference numeral 82 designates a silicon nitride film.

First, as in the case of the first embodiment, the trench isolation structures, the source/drain regions 10 through 15, the polysilicon layer 6, the silicon nitride film 81, and the side walls 8 are formed on the surface of the semiconductor substrate 1. The silicon nitride film 82 is formed over the entire surface of the semiconductor substrate 1 to a thickness of about 10 to 30 nm by means of CVD. As in the case of the first embodiment, the silicon oxide film 63 is formed to a thickness of about 300 to 800 nm and is smoothed by means of the CMP technique. FIG. 15 is a cross-sectional view showing the semiconductor device after completion of this manufacturing step. As in the case of the first embodiment, after the remaining silicon oxide film 63 has been eliminated through use of hydrogen fluoride acid, the silicon nitride film 82 is eliminated by etching. FIG. 16 is a cross-sectional view showing the semiconductor device after completion of this manufacturing step. In other respects, the semiconductor device manufacturing method according to the third embodiment is identical with that described in connection with the first embodiment. It is be noted that a silicon nitride-oxide film (not shown) may be used in place of both of or one of the silicon nitride film 81 and 82, although an etch selectivity against a silicon oxide film becomes lower than that obtained when the silicon nitride film 81 and 82 is employed.

The method of manufacturing the semiconductor device according to the third embodiment yields the same advantage as that yielded by the semiconductor device manufacturing method according to the first embodiment, as well as an advantage of improving the reliability of the semiconductor device and realizing a high yield, because the silicon nitride film or the silicon nitride-oxide film is formed as a protective film on the surface of the silicon oxide film 4 embedded in the trenches 2, thereby preventing electrical conduction and flow of a leakage current between the metal silicide layer 7 formed on the surfaces of the source/drain regions 12 through 15 and the semiconductor substrate 1, which would otherwise be caused when the silicon oxide film 4 is etched by hydrofluoric acid, to thereby form recesses.

The major benefits of the present invention described above are summarized as follows:

According to the first aspect of the present invention, after a polysilicon layer, which is to act as the gate electrodes of the DRAM memory cell and those of the logic circuit, has been patterned on a single semiconductor substrate, the silicon nitride film and the silicon oxide film are formed on the semiconductor substrate. A metal silicide layer is formed by means of the salicide technique after only the surface of the polysilicon layer, which is to act as the gate electrode, and the source/drain regions of the logic circuit region is exposed. As a result, the metal silicide layer is formed on the gate electrode of the DRAM memory cell, the gate electrode and the source/drain regions of the logic circuit. In contrast, no metal silicide is formed on the source/drain regions of the DRAM memory cell. Further, the present invention prevents a leakage current from developing between the semiconductor substrate and the metal silicide layer which is formed on the surface of the source/drain region of LDD structure having a shallow junction and the surface of the source/drain region adjoining the isolation oxide film, both disposed within the logic circuit. As a result, a metal silicide layer is formed on the gate electrode of the DRAM memory cell and the gate electrode and source/drain regions of the logic circuit by means of the salicide technique, whereby the gate electrodes and the source/drain regions are reduced in electrical resistance. Accordingly, a delay in the logic circuit and the DRAM memory cell is prevented, and no silicide layer is formed on the surfaces of the source/drain regions of the DRAM memory cell. Therefore, a leakage current is prevented from developing in the capacitor, thus improving the refresh characteristics of the DRAM memory cell. In this way, the present invention provides a method of manufacturing a semiconductor device which can achieve improved reliability and reduced power consumption and improve the performance and processing speed of integrated circuits by assembly of the integrated circuits into a single chip.

According to the second aspect of the present invention, the silicon oxide film is used so as to form no metal silicide layer in the source/drain regions of the DRAM memory cell while forming the metal silicide layer on only the surfaces of the gate electrode of the DRAM memory cell and the gate electrode and source/drain regions of the logic circuit. At the time of removal of the silicon oxide film, a silicon nitride film is formed on the surfaces of the semiconductor substrate as a protective film. Therefore, there is no risk of forming recesses in the surface of the semiconductor substrate, which would otherwise be formed when the silicon oxide film embedded in the trenches of the trench isolation structures is etched simultaneous with removal of the silicon oxide film. Further, there is eliminated a risk of a leakage current developing, which would otherwise occur when the metal silicide layer is extended to the semiconductor substrate. Therefore, the refresh characteristics of the DRAM memory cell are improved, and high-yield manufacture of a reliability-improved semiconductor device is achieved.

According to the third aspect of the present invention, the BPSG film is used for forming no metal silicide layer in the source/drain regions of the DRAM memory cell, while forming the metal silicide layer only in the surfaces of the gate electrode of the DRAM memory cell and the gate electrode and source/drain regions of the logic circuit. The BPSG film ensures a sufficient etch selectivity against the silicon oxide film embedded in the trenches of the trench isolation structures. As a result, there is no risk of recesses being formed in the surface of the semiconductor substrate in the boundary region, which would otherwise occur when the silicon oxide film embedded in the trenches of the trench isolation structures is etched simultaneously with removal of the BPSG film. Further, there is eliminated a risk of a leakage current flowing, which would otherwise occur when the metal silicide layer is extended to the semiconductor substrate. Therefore, the refresh characteristics of the DRAM memory cell are be improved, and high-yield manufacture of a semiconductor device of improved reliability can be achieved.

According to the fourth aspect of the present invention, the gate oxide film of the logic circuit is made thinner than that of the DRAM memory cell, and hence the gate oxide film of the DRAM memory cell is prevented from being damaged even when a high voltage load is applied to the gate electrode during reading/writing operations. Further, a sufficient ON current flows to the logic circuit, and hence there can be obtained a method of manufacturing a high-performance, high-speed transistor.

According to the fifth aspect of the present invention, the metal silicide layer is formed from one of metals such as Co, Ti, Ni, Mo, or W. Those kinds of metals selectively react with silicon even in a low temperature condition, as well as are capable of formation of metal silicide layer having low electrical resistance.

According to the sixth aspect of the present invention, since the metal reacts with the silicon at a low temperature, a silicon nitride film or a like film is not transformed into a metal silicide film. Accordingly, a metal silicide layer can be formed only on silicon of the semiconductor substrate or a polysilicon layer. Further, the semiconductor substrate is subjected to heat treatment at a comparatively high temperature, and hence the electrical resistance of the metal silicide layer formed on silicon can be reduced. Thus, there can be obtained a method of manufacturing a semiconductor device of reduced power consumption which enables improvement in the performance of integrated circuits and increases the processing speed of the semiconductor device by assembly of the integrated circuits into a single chip.

Further, the present invention is not limited to these embodiments, but variations and modifications may be made without departing from the scope of the present invention.

The entire disclosure of Japanese Patent Application No. Hei11-143196 filed on May 24, 1999 including specification, claims, drawings and summary are incorporated herein by reference in its entirety.

What is claimed is:

1. A method of manufacturing a semiconductor device, comprising the steps of:

forming an isolation dielectric film so as to surround first and second active regions formed on the primary surface of a semiconductor substrate;

forming a polysilicon layer which is patterned so as to act as a gate electrode on the surfaces of the first and second active regions upon which a layer of gate oxide has been formed;

implanting impurities into the semiconductor substrate while the polysilicon layer is used as a mask, to thereby form first source/drain regions in the first active region and second source/drain regions in the second active region;

forming a first silicon nitride film so as to cover the first and second active regions;

forming a photoresist mask such that an opening corresponds to the position of the second active region on the surface of the first silicon nitride film;

etching the first silicon nitride film using the photoresist mask to thereby form side walls on the polysilicon layer on the surface of the second active region;

removing the photoresist mask;

forming a silicon oxide film so as to cover the first and second active regions;

smoothing and removing the silicon oxide film and the first silicon nitride film on the surfaces of the first and second active regions, until the polysilicon layer on the surfaces of the first and second active regions are exposed;

forming a metal layer so as to cover the first and second active regions;

forming a metal silicide layer, through heat treatment, on the surfaces of the second source/drain regions and the surface of the polysilicon layer on the surfaces of the first and second active regions;

removing the metal layer that has not reacted; and forming a capacitor which is connected to one of the first source/drain regions.

2. The method of manufacturing a semiconductor device according to claim 1, further comprising a step of:

forming a second silicon nitride film so as to cover the first and second active regions after formation of side walls and removal of a photoresist film and before formation of a silicon oxide film;

wherein at the time of removal of the silicon oxide film and the first silicon nitride film on the surfaces of the first and second active regions, a portion of the second silicon nitride film is also removed.

3. The method of manufacturing a semiconductor device according to claim 2, further comprising the steps of:

after the gate oxide film has been formed on the first and second active regions of the primary surface of the semiconductor substrate, removing the gate oxide film from the second active region; and forming another gate oxide film so as to cover the first and second active regions before formation of a polysilicon layer.

4. The method of manufacturing a semiconductor device according to claim 3, wherein the metal layer comprises any one of a Co layer, a Ti layer, an Ni layer, an Mo layer, and a W layer.

5. The method of manufacturing a semiconductor device according to claim 4, further comprising a step of subjecting the semiconductor substrate to heat treatment, after the removal of the metal layer that has not reacted and before the formation of the capacitor.

6. The method of manufacturing a semiconductor device according to claim 2, wherein the metal layer comprises any one of a Co layer, a Ti layer, an Ni layer, an Mo layer, and a W layer.

7. The method of manufacturing a semiconductor device according to claim 6, further comprising a step of subjecting the semiconductor substrate to heat treatment, after the removal of the metal layer that has not reacted and before the formation of the capacitor.

8. The method of manufacturing a semiconductor device according to claim 1, further comprising the steps of:

after the gate oxide film has been formed on the first and second active regions of the primary surface of the semiconductor substrate, removing the gate oxide film from the second active region; and forming another gate oxide film so as to cover the first and second active regions before formation of a polysilicon layer.

9. The method of manufacturing a semiconductor device according to claim 8, wherein the metal layer comprises any one of a Co layer, a Ti layer, an Ni layer, an Mo layer, and a W layer.

10. The method of manufacturing a semiconductor device according to claim 9, further comprising a step of subjecting the semiconductor substrate to heat treatment, after the removal of the metal layer that has not reacted and before the formation of the capacitor.

11. The method of manufacturing a semiconductor device according to claim 1, wherein the metal layer comprises any one of a Co layer, a Ti layer, an Ni layer, an Mo layer, and a W layer.

12. The method of manufacturing a semiconductor device according to claim 11, wherein the metal layer comprises any one of a Co layer, a Ti layer, an Ni layer, an Mo layer, and a W Layer.

13. The method of manufacturing a semiconductor device according to claim 12, further comprising a step of subjecting the semiconductor substrate to heat treatment, after the removal of the metal layer that has not reacted and before the formation of the capacitor.

14. The method of manufacturing a semiconductor device according to claim 11, further comprising a step of subjecting the semiconductor substrate to heat treatment, after the removal of the metal layer that has not reacted and before the formation of the capacitor.

15. A method of manufacturing a semiconductor device, comprising the steps of:

forming an isolation dielectric film so as to surround first and second active regions formed on the primary surface of a semiconductor substrate;

forming a polysilicon layer which is patterned so as to act as a gate electrode on the surfaces of the first and second active regions upon which a layer of gate oxide has been formed;

implanting impurities into the semiconductor substrate while the polysilicon layer is used as a mask, to thereby form first source/drain regions in the first active region and second source/drain regions in the second active region;

forming a first silicon nitride film so as to cover the first and second active regions;

forming a photoresist mask such that an opening corresponds to the position of the second active region on the surface of the first silicon nitride film;

etching the first silicon nitride film using the photoresist mask, to thereby form side walls on the polysilicon layer on the surface of the second active region;

removing the photoresist mask;

forming a borophosphosilicate glass (BPSG) film so as to cover the first and second active regions;

smoothing and removing the BPSG film and the first silicon nitride film on the surfaces of the first and second active regions, until the polysilicon layer on the surfaces of the first and second active regions are exposed;

removing the remaining BPSG film;

forming a metal layer so as to cover the first and second active regions;

forming a metal silicide layer, through heat treatment, on the surfaces of the second source/drain regions and the surface of the polysilicon layer on the surfaces of the first and second active regions;

removing the metal layer that has not reacted; and forming a capacitor which is connected to one of the first source/drain regions.

16. The method of manufacturing a semiconductor device according to claim 15, further comprising the steps of:

after the gate oxide film has been formed on the first and second active regions of the primary surface of the semiconductor substrate, removing the gate oxide film from the second active region; and forming another gate oxide film so as to cover the first and second active regions before formation of a polysilicon layer.

17. The method of manufacturing a semiconductor device according to claim 15, wherein the metal layer comprises any one of a Co layer, a Ti layer, an Ni layer, an Mo layer, and a W layer.

18. The method of manufacturing a semiconductor device according to claim 17, further comprising a step of subjecting the semiconductor substrate to heat treatment, after the removal of the metal layer that has not reacted and before the formation of the capacitor.

* * * * *